United States Patent
Kretschmann et al.

(10) Patent No.: US 9,492,846 B2
(45) Date of Patent: Nov. 15, 2016

(54) PROCESS FOR THE MANUFACTURE OF A MULTILAYER SILICONE STRUCTURE

(71) Applicant: MOMENTIVE PERFORMANCE MATERIALS GMBH, Leverkusen (DE)

(72) Inventors: Oliver Kretschmann, Düsseldorf (DE); Markus Putzer, Odenthal (DE); Cristian De Santis, Duisburg (DE); Andrea Ruppenthal, Leverkusen (DE); Carsten Koopmanns, Düsseldorf (DE)

(73) Assignee: Momentive Performance Materials GmbH, Leverkusen (DE)

( * ) Notice: Subject to any disclaimer, the term of this patent is extended or adjusted under 35 U.S.C. 154(b) by 0 days.

(21) Appl. No.: 14/417,202

(22) PCT Filed: Aug. 2, 2013

(86) PCT No.: PCT/EP2013/066245
§ 371 (c)(1),
(2) Date: Jan. 26, 2015

(87) PCT Pub. No.: WO2014/020136
PCT Pub. Date: Feb. 6, 2014

(65) Prior Publication Data
US 2015/0200317 A1 Jul. 16, 2015

(30) Foreign Application Priority Data

Aug. 3, 2012 (EP) .................................. 12179288

(51) Int. Cl.
| | |
|---|---|
| *B05D 1/36* | (2006.01) |
| *B05D 1/38* | (2006.01) |
| *B32B 25/20* | (2006.01) |
| *C08J 5/12* | (2006.01) |
| *C08J 7/04* | (2006.01) |
| *C09D 183/04* | (2006.01) |
| *B32B 17/10* | (2006.01) |
| *H01L 31/048* | (2014.01) |
| *H01L 33/56* | (2010.01) |
| *B05D 7/00* | (2006.01) |
| *B05D 3/06* | (2006.01) |
| *B05D 3/10* | (2006.01) |
| *B05D 5/12* | (2006.01) |
| *B05D 7/24* | (2006.01) |
| *C09D 183/14* | (2006.01) |
| *C08L 83/04* | (2006.01) |
| *H01L 31/0203* | (2014.01) |
| *H01L 31/04* | (2014.01) |
| *C08G 77/12* | (2006.01) |
| *C08G 77/20* | (2006.01) |

(52) U.S. Cl.
CPC ................. *B05D 7/546* (2013.01); *B05D 1/38* (2013.01); *B05D 3/065* (2013.01); *B05D 3/067* (2013.01); *B05D 3/107* (2013.01); *B05D 3/108* (2013.01); *B05D 5/12* (2013.01); *B05D 7/24* (2013.01); *B32B 17/10697* (2013.01); *B32B 17/10798* (2013.01); *C08L 83/04* (2013.01); *C09D 183/04* (2013.01); *C09D 183/14* (2013.01); *H01L 31/0203* (2013.01); *H01L 31/04* (2013.01); *H01L 31/0481* (2013.01); *C08G 77/12* (2013.01); *C08G 77/20* (2013.01); *Y02E 10/50* (2013.01); *Y10T 428/31663* (2015.04)

(58) Field of Classification Search
None
See application file for complete search history.

(56) References Cited

U.S. PATENT DOCUMENTS 7,572,514 B2    8/2009  Howe et al.

FOREIGN PATENT DOCUMENTS

| EP | 0866164 A1 | 9/1998 |
|---|---|---|
| JP | 2004-202966 A * | 7/2004 |
| WO | 2009/114190 A2 | 9/2009 |
| WO | WO 2009/114190 A2 * | 9/2009 |
| WO | 2011/107592 A1 | 9/2011 |
| WO | WO 2011/107592 A1 * | 9/2011 |

OTHER PUBLICATIONS

International Search Report for corresponding PCT/EP2013/066245 mailed Sep. 12, 2013, three pages.
European Patent Abstract for JP Publication No. 2004202966 published Jul. 22, 2004, one page.
Thompson Database for JP Publication No. 2004-202966 published Jul. 22, 2004, three pages.
International Preliminary Report on Patentability for corresponding PCT/EP2013/066245 mailed Feb. 12, 2015, nine pages.

* cited by examiner

*Primary Examiner* — William Phillip Fletcher, III
(74) *Attorney, Agent, or Firm* — Rankin, Hill & Clark LLP

(57) ABSTRACT

A process for the manufacture of a multilayer silicone structure of cured silicone elastomer layers wherein the compositions of each of the curable silicone elastomers are chosen such as to provide excellent layer-to-layer adhesion of the said cured silicone elastomer layers, that is, the layers do not suffer from cohesive failure. The multilayer silicone structures may be used for example for the manufacture of electronic devices, coatings, shaped molded articles, laminates, etc.

18 Claims, No Drawings

PROCESS FOR THE MANUFACTURE OF A MULTILAYER SILICONE STRUCTURE

FIELD OF THE INVENTION

The present invention is directed to a process for the manufacture of a multilayer silicone structure of cured silicone elastomer layers wherein the compositions of each of the curable silicone elastomers are chosen such as to provide excellent layer-to-layer adhesion of the said cured silicone elastomer layers, that is, the layers do not suffer from cohesive failure. The multilayer silicone structures may be used for example for the manufacture of electronic devices, coatings, shaped molded articles, laminates, etc. The multilayer silicone structures are particularly useful for the manufacture of encapsulated or embedded electronic devices such as encapsulated embedded solar cell modules, encapsulated or embedded integrated circuits; electrical insulators, encapsulated or embedded LEDs, intermediate layers of displays, monitors or screens, impression materials.

BACKGROUND OF THE INVENTION

There are many processes wherein articles, such as electronic devices, coatings, encapsulations or shaped articles have to be manufactured as multilayered bodies since the process requires to use, at first an adhesion layer or support material before the final coating is applied or the final article is completed. Examples of such processes are, in particular, printing, coating, encapsulation or other mounting processes. The encapsulation of solar cells in photovoltaic modules using silicones is e.g. possible by a one step process, but then the wafer-type semiconductor has to be fixed by any other means. If a two step process is applied i.e. the currently proposed materials have some disadvantages in terms of curing rates, transparency or additional process steps. It has been observed that if addition cured silicone rubbers are used in a first layer to adhere and fix e.g. a semiconductor or are used as a primer layer or a support for the next layer then such next layer does not adhere onto the cured first layer. Another requirement for such interfaces between the two layers is the resistance against some outstanding climate conditions and the need to adhere on many other substrates. Either only the first layer should adhere to such a substrate or both layers should adhere to a substrate in order to provide a multilayered adhesion body between two substrates. This requires on the one hand a good adhesion of the (in particular two) silicone layers to several substrates, i.e. glass, plastic layers such as, thermoplastic or duromeric films, sheets, boxes, metal conductors or semiconductors, such as wafer-type silicon cells, metals, ceramic, glass and also glass-fibre reinforced plastic, and on the other hand the silicone layers must have an excellent layer-to-layer adhesion, that is, the layers must not suffer form cohesive failure during the life-time of the articles comprising them.

Currently photovoltaic cells are generally encapsulated via a vacuum lamination process using ethylene-vinyl acetate (EVA) at approximately 150° C. instead of using silicone layers. Silicone encapsulants were the material of choice due to their insulating properties and their resistibility against extreme temperature changes and radiation for the early manufacture of photovoltaic modules, particularly for satellites and spacecraft. In mass production processes, when solar modules were beginning to be built for the terrestrial market, organic encapsulants like EVA replaced silicones. In recent years long-time durability and efficiency increase has became more important, so that again silicone with its UV radiation stability has become more preferred. In order to build modules with defined front and back layer upon semiconductors with defined thickness a two layer encapsulation process is necessary. The preferred silicone elastomer materials are addition curable or UV curable two-part silicone compositions. Within this kind of processes there is in particular a need for a process wherein a first silicone layer between glass superstrate and semiconductor cells is cured and in a second step a silicone layer is sealed while curing onto the first coated substrate to achieve a complete encapsulation of the semiconductor and parts of the metallic leads.

It is a general experience that not all silicone elastomers curable by a hydrosilylation reaction adhere to each other, when cured stepwise.

EP 431979 describes a silicone composite of an addition cured silicone gel which can be laminated with a vinylsiloxane polymer, which builds a fully flexible and secured gel layer. U.S. Pat. No. 4,889,576 specifies the connection between silicone-coated fabrics via a silicone rubber adhesive to produce big and seamless silicone coated fabrics. The patent discloses a process to build up silicone laminates via consecutive 2 step polyaddition reactions. U.S. Pat. No. 7,572,514 B2 describes in particular the application of silicone elastomers as multilayer coating for the protection or mechanical strengthening of various flexible substrates such as woven or non-woven fibrous substrates in relative thin thicknesses. The examples are silent about filler-containing compositions. While the feature of a surface density SD of the unreacted, residual alkenyl groups, per $nm^2$ in the first layer appear to be essential, the method of determining such parameter does not appear to be clear at all. Moreover, while the patent describes that the ratio R of the SiH-groups to the Si-alkenyl-groups is defined to be ≤1 (corresponding to a Si-alkenyl excess) it appears that none of the examples satisfy such a feature, leaving doubt about the underlying invention. Furthermore in this respect the patent also does not describe the circumstances in the second layer leaving alone for a filler-containing layer. WO 2011107592 is related to PV-encapsulant compositions comprising silica fillers, which have excellent adhesive properties towards glass at long time damp-heat conditions. The description does not disclose adhesion of these silicones to each other after one of these compositions is already cured. EP 1644989 describes a 2-step process using an encapsulation process wherein first a semiconductor wafer is placed onto glass superstrate using an uncured silicone resin adhesive. After the curing step of the first adhesive layer a second encapsulant composition is uniformly applied to totally encapsulate the whole module by means of curtain coaters. WO 2011151430 describes a two-step encapsulation process for manufacturing solar modules using for example liquid or paste like silicone compositions. In this process a layer is applied on the glass superstrate which can be cured after both are rolled onto the semiconductor sheets and a second layer. The second layer which comprises the same material is coated over the semiconductor onto the opposite side of the semiconductor and parts of the first layer. U.S. Pat. No. 4,057,439 discloses an encapsulation process wherein a carrier tray is first coated with a two part addition curable silicone composition to build a layer, then is cured. In the next step the semiconductor sheets or wafers are encapsulated by a second silicone composition such as another two-part addition curable silicone which is more transparent establishing a thicker layer adhering to the first silicone layer having a high resistance against delamination. U.S. Pat. No. 4,322,261 describes a solar PV-encapsulant system, which has two silicone compositions selected from different or identical materials, whereby at least one of the two silicone materials is a heat vulcanizable EVC (Elastomères Vulcanisant à Chaud) material cured by peroxides at 110-180° C. WO2012041674 discloses a process for the manufacture of light cured silicone insulators, whereby a conventional primer is used and hardened in the presence of an UV-sensitive crosslinking catalyst which has been added in any desired sequence, i.e. before, during or after hardening of said silicone primer composition.

SUMMARY OF THE INVENTION

Accordingly the present invention is related to a multi-layer silicone structure obtained from a system of addition (or light, in particular, UV light) curable silicone compositions comprising at least of two silicone compositions whereby a second composition 2) is applied and cured onto a first composition 1). More specifically the present invention is related to a process for the manufacture of a multi-layer silicone structure, comprising the steps of:

a) Applying a first curable silicone composition 1) to the surface of a first substrate, wherein said first silicone composition 1) comprises:
  1-A) one or more polyorganosiloxanes having at least two alkenyl groups per molecule;
  1-B) one or more oxidic fillers, optionally hydrophobized by reaction with one or more hydrophobing agents 1-C);
  1-D) one or more a metal catalysts;
  1-E) one or more polyorganosiloxanes having at least two SiH groups per molecule;
  wherein
  (i) the molar ratio of all SiH groups in the composition 1) to all alkenyl groups in the composition 1) is from 0.25 to 4, preferably 0.25 to 2.5, more preferably 0.25 to 2.0;
  (ii) in case the molar ratio of all SiH groups in the composition 1) to all alkenyl groups in the composition 1) is from >1 to 4, the molar ratio of the difference:
    (molar amount of all SiH-groups in the composition 1)—molar amount of all alkenyl groups in the composition 1))
    to
    the molar amount of the oxidic filler 1-B) is <0.035;
b) optionally curing said first curable silicone composition 1) on the surface of said first substrate;
c) applying a second curable silicone composition 2) to the surface of said first silicone composition 1), wherein said second curable silicone composition 2) comprises:
  2-A) one or more polyorganosiloxanes having at least two alkenyl groups per molecule;
  2-B) optionally one or more oxidic fillers, optionally hydrophobized by reaction with one or more hydrophobing agents 2-C);
  2-D) one or more a metal catalysts;
  2-E) one or more polyorganosiloxanes having at least two SiH groups per molecule;
  wherein the molar ratio of all SiH groups in the composition 2) to all alkenyl groups in the composition 2) to is from >1 to 10, preferably from 1.05 to 10;
d) curing said second curable silicone composition 2), optionally together with said first curable silicone composition 1).

DETAILED DESCRIPTION OF THE INVENTION

According to one embodiment of the invention said first curable silicone composition 1) and second curable silicone composition 2) are cured by irradiation and/or heat, preferably both curable silicone composition are heat-curable.

According to a further embodiment of the invention said first curable silicone composition 1) is applied to said first substrate in an amount to provide a dry film thickness of 100 to 1000 µm, or said first curable silicone composition 1) is applied to provide a wall thickness of the cured first layer on the first substrate of more than 1 mm.

According to a further embodiment of the invention said second curable silicone composition 2) is applied to provide, or said second curable silicone composition 2) is applied in an amount to provide a dry film thickness of 100 to 1000 µm or a wall thickness of the cured second layer of more than 1 mm.

According to a further embodiment of the invention said first curable silicone composition 1) has a viscosity of 1 to 100 Pa·s (25° C.—shear rate D=10 s$^{-1}$).

According to a further embodiment of the invention said second curable silicone composition 2) has a viscosity of 0.1 to 200 Pa·s (25° C.—shear rate D=10 s$^{-1}$).

According to a further embodiment of the invention said first curable silicone composition 1) comprises, based on 100 parts per weight of component 1-A), 10 to 50 parts by weight of component 1-B).

According to a further embodiment of the invention also said second curable silicone composition 2) comprises the component 2-B), preferably in an amount of 10 to 50 parts by weight based on 100 parts per weight of component 2-A).

According to a further embodiment of the invention said first curable silicone composition 1) comprises 1-E) one or more polyorganosiloxanes having at least two SiH groups per molecule selected from the group of linear poly(hydrogenalkyl)siloxanes having more than 20 hydrogenalkylsiloxy groups, preferably more than 23 hydrogenalkylsiloxy groups.

According to a further embodiment of the invention also said second curable silicone composition 2) comprises 2-E) one or more polyorganosiloxanes having at least two SiH groups per molecule selected from the group of linear poly(hydrogenalkyl)siloxanes having more than 20 hydrogenalkylsiloxy groups, preferably more than 23 hydrogenalkylsiloxy groups.

According to a further embodiment of the invention said first curable silicone composition 1) and/or said second curable silicone composition 2) comprise at least one adhesion promotor as described in detail below.

In the following the components used for the manufacture of the curable silicone compositions are described in more detail.

Components 1-A) and 2-A)

Components 1-A) and 2-A) (in the following simply referred to as component (A)), i.e. one or more polyorganosiloxanes having at least two alkenyl groups per molecule can be the same or different for both silicone compositions, 1) and 2), or layers 1) and 2) formed therefrom respectively. Preferably for both silicone compositions, 1) and 2), or layers 1) and 2) formed therefrom, components 1-A) and 2-A) are the same.

Component (A) may include one or more polyorganosiloxanes having in average at least two alkenyl groups which can be described in particular by the general formula

  (1)

wherein the indices in formula (1) represent the ratios of the known siloxy units M, D, T and Q, which can be distributed blockwise or randomly in the polysiloxane. Within a polysiloxane each siloxane unit can be identical or different and
a=0-10
b=0-2000
c=0-50
d=0-1
e=0-300
m=1-1000
with a, b, c, d and m being preferably such that the viscosity of component (A) at 25° C. is preferably 0.025 to 200 Pa·s, more preferably 0.2 to 60 Pa·s still more preferably less than 50 Pa·s (measured each at a shear rate of D=10 s$^{-1}$ at 25° C.).

Here the viscosity of component (A) refers to the viscosity of a single component (A) or a mixture of components (A). The latter case of the mixture includes with it the presence of individual components (A) that may have a viscosities exceeding the aforementioned ranges, for example resinous components (A), that comprise Q and or T units.

In formula (1) the indices should represent the average polymerisation degree $P_n$ based on the average number molecular mass $M_n$.

In the formula (1) M, D, T and Q correspond according to the known nomenclature of silicones to:
M=$R_3SiO_{1/2}$, or M*
D=$R_2SiO_{2/2}$, or D*
T=$RSiO_{3/2}$, or T*
Q=$SiO_{4/2}$,
divalent $R^B$, which are bridging groups between siloxy groups above.

Therein each R, which may be the same or different, and is preferably selected from optionally substituted linear, branched and/or cyclic alkyl groups with preferably up to 30 carbon atoms, which may optionally have one or more heteroatoms selected from O-, N-, S- and F-atoms, optionally substituted aryl with up to 30 carbon atoms, poly($C_2$-$C_4$)-alkylene ether groups with up to 1000 alkylene oxy units, the groups R being free of aliphatic unsaturation.

Preferably the groups R are selected from n-, iso, or tertiary alkyl, alkoxyalkyl, $C_5$-$C_{30}$-cyclic alkyl, or $C_6$-$C_{30}$-aryl, alkylaryl, which groups can be substituted in addition by one or more O-, N-, S- or F-atom, or poly($C_2$-$C_4$)-alkylene ethers with up to 500 alkylene oxy units.

Specific examples of suitable monovalent hydrocarbon radicals include said alkyl radicals, such as $CH_3$—, $CH_3CH_2$—, $(CH_3)_2CH$—, $C_8H_{17}$—and $C_{10}H_{21}$—, and cycloaliphatic radicals, such as cyclohexylethyl, aryl radicals, such as phenyl, tolyl, xylyl, aralkyl radicals, such as benzyl and 2-phenylethyl. Preferred monovalent halohydrocarbon radicals have the formula $C_nF_{2n+1}CH_2CH_2$— wherein n has a value of from 1 to 10, such as, for example, $CF_3CH_2CH_2$—, $C_4F_9CH_2CH_2$—, $C_6F_{13}CH_2CH_2$—, $C_2F_5$—$O(CF_2$—$CF_2$—$O)_{1-10}$ $CF_2$—, $F[CF(CF_3)$—$CF_2$—$O]_{1-5}$—$(CF_2)_{0-2}$—, $C_3F_7$—$OCF(CF_3)$— and $C_3F_7$—$OCF(CF_3)$—$CF_2$—$OCF(CF_3)$—.

Still more preferred groups for R are methyl, phenyl, 3,3,3-trifluoropropyl. Most preferred R is methyl.

Siloxy units M*, D* and T* are those siloxy groups that carry the alkenyl groups. Thus polyorganosiloxanes of the general formula (1) must comprise at least one of those groups to provide in average at least two alkenyl groups.

Preferably:

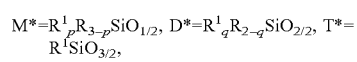

wherein
p=0-3, preferably 1-3,
q=1-2, and
wherein R is as defined above.

$R^1$ is selected from unsaturated groups, comprising C=C-containing groups (i.e. alkenyl groups), e.g.: n-, iso-, tertiary or cyclic alkenyl groups having preferably up to 30 carbon atoms, and optionally comprising one or more heteroatoms including, in particular, O and F, like linear or branched $C_2$-$C_{30}$-alkenyl, $C_6$-$C_{30}$-cycloalkenyl, $C_8$-$C_{30}$-alkenylaryl, cycloalkenylalkyl, in particular, vinyl, allyl, methallyl, 3-butenyl, 5-hexenyl, 7-octenyl, ethyliden-norbornyl, styryl, vinylphenylethyl, norbornenyl-ethyl, limonenyl, optionally substituted by one or more O- or F-atoms, or C≡C-group-containing groups (alkinyl groups), optionally comprising one or more O- or F-atoms.

The alkenyl radicals are preferable attached to terminal silicon atoms, the olefin function (C=C) is at the end of the alkenyl group of the higher alkenyl radicals, because of the more ready availability of the alpha,omega-dienes used to prepare such alkenylsiloxanes.

Particular preferred groups for $R^1$ are vinyl, 5-hexenyl, cyclohexenyl, limonyl, styryl, and vinylphenylethyl. Most preferred group $R^1$ is vinyl.

Thus the most preferred polyorganosiloxanes having at least two alkenyl groups per molecule are polyorganosiloxanes comprising methyl and vinyl groups as the organic groups.

$R^B$ forms brigding elements between two siloxy units. Bridging group $R^B$ includes for example divalent aliphatic or aromatic n-, iso-, tertiary- or cyclo-alkylene preferably with up to 30 carbon atoms, arylene or alkylenearyl groups with up to 30 carbon atoms. Such groups may carry one or more heteroatoms in particular halogen, such as fluorine, chlorine or bromine. The content of the $R^B$ groups does not exceed 30 mol. % preferably not exceed 20 mol. % of all siloxy units. Preferably $R^B$ is absent. Particularly preferred examples of suitable divalent hydrocarbon groups $R^B$ include any alkylene residue, preferably such as —$CH_2$—, —$CH_2CH_2$—, —$CH_2(CH_3)CH$—, —$(CH_2)_4$—, —$CH_2CH(CH_3)CH_2$—, —$(CH_2)_6$—, —$(CH_2)_8$— and —$(CH_2)_{18}$—; cycloalkylene radical, such as cyclohexylene; arylene radicals, such as phenylene, xylene and combinations of hydrocarbon radicals, such as benzylene, i.e. —$CH_2CH_2$—$C_6H_4$—$CH_2CH_2$—, —$C_6H_4CH_2$—. Most preferred groups $R^B$ are alpha,omega-ethylene, alpha,omega-hexylene or 1,4-phenylene.

Further examples include divalent halohydrocarbon radicals $R^B$ e.g. any divalent hydrocarbon group $R^B$ wherein one or more hydrogen atoms have been replaced by halogen, such as fluorine, chlorine or bromine. Preferable divalent halohydrocarbon residues have the formula —$CH_2CH_2(CF_2)_{1-10}CH_2CH_2$— such as for example, —$CH_2CH_2CF_2CF_2CH_2CH_2$— or other examples of suitable divalent hydrocarbon ether radicals and halohydrocarbon ether radicals including —CH$_2$CH$_2$OCH$_2$CH$_2$—, —C$_6$H$_4$—O—C$_6$H$_4$—, —CH$_2$CH$_2$CF$_2$OCF$_2$CH$_2$CH$_2$—, and —CH$_2$CH$_2$OCH$_2$CH$_2$CH$_2$—.

Thus polyorganosiloxane component (A) containing R, R$^1$ and/or R$^B$ radicals are in particular:
- alkenyl-dimethylsiloxy terminated polydimethylsiloxanes, wherein optionally part of the dimethylsiloxy groups are replaced by alkenylmethylsiloxy groups;—most preferred are alkenyl-dimethylsiloxy terminated polydimethylsiloxanes
- trimethylsiloxy terminated polydimethylsiloxanes comprising alkenylmethylsiloxy groups.

In these polyorganosiloxanes dimethylsiloxy groups might be replaced by diphenylsiloxy groups such as to form poly(dimethyl-co-diphenyl)siloxanes.

Broadly stated polyorganosiloxane components (A) of the curable silicone composition 1) and 2) of this invention can be any polyorganosiloxane compound containing two or more silicon atoms linked by oxygen and/or divalent groups R$^B$, wherein the silicon is bonded to 0 to 3 monovalent organic groups per silicon atom, with the proviso that the polyorganosiloxane compounds contain at least two silicon-bonded alkenyl groups as explained above.

The siloxane units in these polyorganosiloxane components (A) with radicals R and/or R$^1$ can be equal or different for each silicon atom. In a preferred embodiment the structure is $$R^1_p R_{3-p} SiO[R_2SiO]_{m1}[R^1RSiO]_n SiR^1_p R_{3-p} \quad (2)$$

With:
p=0-3, preferably 1,
m1=0-2000, preferably 10-1000,
n=0-500 preferably 0-200.

A preferred polyorganosiloxane component (A) for the composition of this invention is a substantially linear polyorganosiloxane (A1). The expression "substantially linear" includes polyorganosiloxanes (A1) that contain not more than 0.2 mol. % (trace amounts) of siloxy units of the type T or Q. This means the polyorganosiloxane components (A) are preferably are a linear, flowable fluid (A1) in particular of the formula:

$$R^1_p R_{3-p} SiO(R_2SiO)_{m1} SiR_{3-p} R^1_p \quad (1a)$$

wherein R$^1$, R, p and m1 are as defined above,
with the proviso, that there are at least two alkenyl groups (R$^1$) per molecule.

Particular preferred structures include:

$$Vi_p Me_{3-p} SiO(Me_2SiO)_{10-2000} SiMe_{3-p} Vi_p \quad (1b)$$

$$PhMeViSiO(Me_2SiO)_{10-2000} SiPhMeVi \quad (1c),$$

In the group of the alkenyl siloxanes (A) the addition of a second or third siloxane as component (A2) and/or (A3) described in the following is an option. The purpose of components (A2) and (A3) which are so-called vinyl-rich polymers is to modify mechanical properties and crosslinking density.

The polymers (A2) are selected either from the group consisting of polymers of the formulas (1d) to (1i), i.e. linear polyorganosiloxanes having additional alkenyl side groups wherein the concentration of T- and Q-groups are below 0.2 mol. % or polyorganosiloxanes having a higher concentration of T- and Q-groups than the previous polymer types (A1) or (A2).

The polymers (A2) are represented by the following formulas $$R^1_p R_{3-p}(R_2SiO)_{b1}(R^1R\ SiO)_{b1x}SiR_{3-p}R^1_p \quad (1d),$$

$$Me_3SiO(Me_2SiO)_{b1}(MeR^1SiO)_{b1x}SiMe_3 \quad (1e),$$

$$R^1Me_2SiO(Me_2SiO)_{b1}(MeR^1SiO)_{b1x}SiMe_2R^1 \quad (1f),$$

whereby
b1=>0-2000
b1x=0-500
b1+b1x=>10-100
R$^1$, R, p are as defined above,
R$^1$=preferably vinyl, hexenyl, cyclohexenyl, limonyl, styryl, vinylphenylethyl.
Preferred groups for R are methyl, phenyl, 3,3,3-trifluoropropyl.
The preferred value of b1x is less than 0.5*b1, preferably 0.0001*b1 to 0.25*b1 more preferably 0.0015*b1 to 0.2*b1.
Other preferred structures of (A2) are $$Vi_p Me_{3-p} SiO(Me_2SiO)_{10-2000}(MeViSiO)_{1-1000} SiMe_{3-p}Vi_p \quad (1g),$$

$$Me_3SiO(Me_2SiO)_{10-2000}(MeViSiO)_{1-1000}SiMe_3 \quad (1h),$$

$$PhMeViSiO(Me_2SiO)_{10-2000}(MePhSiO)_{1-1000}SiPhMeVi \quad (1i)\ \text{and}$$

wherein Me=methyl, Vi=vinyl, Ph=phenyl, and p=0 to 3, preferred p=1.

The third component used as alkenyl polyorganosiloxanes (A), include branched polymers (A3), which are preferably selected from those of the formula (4a) wherein the polyorganosiloxanes (A3) comprise alkenyl groups and have more than 0.2 mol. % of T=RSiO$_{3/2}$ or Q=SiO$_{4/2}$-units.

$$[M_{0.4-4}D_{0-1000}T_{0-50}Q_{0-1}]_{1-1000} \quad (4a)$$

whereby
M=R$_3$SiO$_{1/2}$, or M*
D=R$_2$SiO$_{2/2}$, or D*
T=RSiO$_{3/2}$, or T*
Q=SiO$_{4/2}$,
wherein M*, D* and T* are as defined above, carrying unsaturated groups R$^1$. The amount of such M*, D* and T* units is preferably 0.001 to 20 mol. %, more preferably 0.01 to 15 mol. %, most preferably 0.1 to 10 mol. % based on all siloxy units.

The range of the subindices defines a range of the possible average polymerization degrees P$_n$ according to the number average molecular weight M$_n$. The indices relate to suitable viscosities as defined lateron and describe in particular polymers without the need of any solvent for a viscosity adjustment.

The preferred branched polyorganosiloxanes (A2) and (A3) usually have a higher concentration of unsaturated groups R$^1$. Branched polymers (A3) are described e.g. in U.S. Pat. No. 5,109,095. Preferably the branched vinyl-rich polymers (A3) have a ratio of D:T>10:1 preferably >33:1 and/or respectively (M:Q)=0.6-4:1, such as e.g. [M$_{0.7}$M$_{0.05}$Q]$_{10-500}$ (1j).

All these polymers can be prepared by any of the conventional methods for preparing triorganosiloxane-terminated polydiorganosiloxanes. For example, a proper ratio of the appropriate hydrolyzable silanes, e.g., vinyldimethylchlorosilane, trimethylchlorsilane, tetrachlorosilane, methyltrichlorsilane and dimethyldichlorosilane, or its corresponding alkoxysilanes, can be co-hydrolyzed and condensed. Other reaction routes may run alternately through equilibration reactions of 1,3-divinyltetraorganodisiloxane, e.g. symmetrical divinyldimethyldiphenylsiloxane or divinyltetramethylsiloxane, which furnishes the endgroups of the polydiorganosiloxane, which may be equilibrated with an appropriate polydiorganosiloxane, e.g., octamethylcyclotetrasiloxane, in the presence of an acidic or basic catalyst.

In a preferred embodiment the polymer component (A) is a mixture of polymers of the formula (1a) and/or of the formula (1d) and/or (1j) whereby the mixture has an alkenyl content in average of preferably below 2 mol-% of all siloxy units of the mixture (A), whereby polymer (A1) is present in a higher amount than (A2) or (A3). The average polymerization degree $P_n$ of the siloxane units (M, D, T, Q) of the polymer(s) (A) measured by GPC measurement versus polystyrene standard based on the average number mol weight $M_n$ is preferably in the range of $P_n$>10 to 2000, the more preferred range is 40 to 1000. The viscosities of such polymers or mixtures of such polymers are for example in the range of 0.025 to 200 Pa·s, more preferably 0.2 to 60 Pa·s still more preferably less than 50 Pa·s (measured each at a shear rate of D=10 s$^{-1}$ at 25° C.).

If a higher viscosity of the silicone compositions is desired the polymer(s) (A) have a viscosity of more than 15 Pa·s at 25° C. at a shear rate of D=10 s$^{-1}$.

The alkenyl content of the components (A) can be determined here for example by way of $^1$H NMR—see A. L. Smith (ed.): The Analytical Chemistry of Silicones, J. Wiley & Sons 1991 Vol. 112 pp. 356 et seq. in Chemical Analysis ed. by J. D. Winefordner.

Components 1-E and 2-E)

Components 1-E) and 2-E) (in the following simply referred to as component (E)), i.e. one or more polyorganohydrogensiloxanes having at least two SiH groups per molecule can be the same or different for both silicone compositions, 1) and 2), or layers 1) and 2) formed therefrom respectively. Preferably for both silicone compositions, 1) and 2), or layers 1) and 2) formed therefrom, components 1-E) and 2-E) are the same.

The component (E) is preferably at least one polyorganohydrogensiloxane having at least seven Si atoms, wherein preferably the molar ratio of SiH-groups to all Si-atoms is more than 0.55, preferably ≥0.6, still more preferably ≥0.7, particularly preferred 0.7 to 0.95.

Suitable polyorganohydrogensiloxanes (B) comprising SiH units can be formally described by the general formula (3), $$[M^1{}_{a2}D^1{}_{b2}T^1{}_{c2}Q_{d2}R^B{}_{e2}]_{m2} \quad (3)$$

wherein the siloxy units
$M^1$=M, as defined above, or M**,
$D^1$=D, as defined above, or D**,
$T^1$=T, as defined above, or T**,
Q as defined above,
$R^B$ as defined above,
M=HR$_2$SiO$_{1/2}$, D=HRSiO$_{2/2}$, T**=HSiO$_{3/2}$,
a2=0.01-10 preferably=2-5, most preferably=2
b2=0-1000 preferably=10-500
c2=0-50 preferably=0
d2=0-1 preferably=0 or 1, most preferably=0
e2=0-3 preferably=0
m2=1-1000, preferably=1-500, most preferably=1.

Preferably the polyorganohydrogensiloxanes (B) according to the general formula (3) have at least seven Si atoms and the molar ratio of SiH-groups (siloxy groups comprising SiH group) to all Si-atoms in the polyorganohydrogensiloxanes (E) is more than 0.55. Preferably the component (E) is  selected from polyorganohydrogensiloxanes that have only methyl or phenyl groups as organic residues.

Preferably the polyorganohydrogensiloxanes (E) have at least 10, preferably at least 15, more preferably at least 20, still more preferably at least 25 and most preferably at least 30 silicon atoms.

The siloxy units can be distributed blockwise or randomly in the polymer chain.

The aforementioned indices represent the average polymerization degree $P_n$ based on the average number molecular mass $M_n$.

The range for M-, D-, T- and Q-units present in the molecule can cover nearly all values representing fluids, flowable polymers, liquid and solid resins. It is preferred to use liquid linear, cyclic or branched siloxanes. Optionally these siloxanes can comprise additionally traces of $C_1$-$C_6$-alkoxy or Si-hydroxy groups remaining from the synthesis. Preferred structures of components (E) in the compositions of this invention are siloxanes of formula (2a) to (2d).

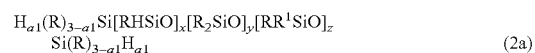

more specifically:

wherein R and $R^1$ are as defined above, R is preferably methyl and/or phenyl, $R^1$ is preferably vinyl, and the index a1 is 0-1, preferably 0, and
x=2-1000, preferably=2-500,
y=0-650, preferably=0-100,
z=0-65, preferably=0
preferably 7≤x+y+z<1000, more preferably 10≤x+y+z<650.

Preferably in each formula (2a)-(2d) the molar ratio of SiH-groups to all Si-atoms is more than 0.55.

Furthermore resinous polyorganohydrogensiloxanes € of the following formulae are possible:

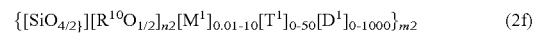

wherein
$T^1$, $M^1$, $D^1$ are as defined above,
n2=0 to 3
m2 is as defined above
$R^{10}$ is hydrogen, $C_1$-$C_{25}$-alkyl, such as methyl, ethyl, n-propyl, iso-propyl, n-, iso- and tert.-butyl, aryl, alkenyl, such as propenyl,
provided the polyorganosiloxanes have at least two SiH groups per molecule,
wherein in each formula (2e)-(2f) the molar ratio of SiH-groups to all Si-atoms is preferably more than 0.55 and the total number of Si atoms is preferably at least 7.

One preferred embodiment of the compounds (2f) is provided by way of example by monomeric to polymeric compounds which can be described via the formula [(Me$_2$HSiO$_{0.5}$)$_k$SiO$_{4/2}$]$_{1.5-1000}$ wherein index k is from 0.3 to 4. Such liquid or resinous molecules can contain significant concentrations of SiOH— and/or ($C_1$-$C_6$)-alkoxy-Si groups of up to 10 mol. % related to the silicon atoms.

Specific examples of preferred suitable compounds for component (E) in the compositions of this invention include
Me$_3$SiO-(MeHSiO)$_{5-650}$—SiMe$_3$,
(MeHSiO)$_7$,
HMe$_2$SiO(Me$_2$SiO)$_{0-300}$(MePhSiO)$_{0-300}$(MeHSiO)$_{1-650}$ SiMe$_2$H,
Me$_3$SiO(Me$_2$SiO)$_{0-300}$(MePhSiO)$_{0-300}$(MeHSiO)$_{2-650}$ SiMe$_3$,
Me$_3$SiO(Me$_2$SiO)$_{0-300}$(Ph$_2$SiO)$_{0-300}$(MeHSiO)$_{2-650}$ SiMe$_3$.

Therein preferably in each formula the molar ratio of SiH-groups to all Si-atoms is more than 0.55 and the total number of Si atoms is at least 7.

The component (E) can be used as a single component of one polyorganosiloxane polymer or mixtures thereof.

If an increase of the cure rate is required, it is preferred to use some organopolysiloxanes (E) having HMe$_2$SiO$_{0.5}$— units or homo MeHSiO-polymers to adjust the cure rate to shorter times.

If it is necessary to still further increase the cure rate, this can be achieved by way of example via an increase of the molar ratio of SiH to Si-alkenyl, or an increased amount of catalyst (D).

The component (E) has preferably a viscosity at 25° C. from 2 to 1000 mPa·s (shear rate D=10 s$^{-1}$)

Preferably the crosslinker (B) should have at least more than 3, more preferably more than 15, still more preferably more than 20 and most preferably more than 25 SiH-groups per molecule.

According to a particular preferred process according to the invention the first curable silicone composition 1) and 2) comprise as 1-E) and 2-E) one or more polyorganosiloxanes having at least two SiH groups per molecule selected from the group of linear poly(hydrogenalkyl)siloxanes having more than 20 hydrogenalkylsiloxy groups, preferably more than 23 hydrogenalkylsiloxy groups.

In accordance with the present invention in the first curable silicone composition 1):
(i) the molar ratio of all SiH groups in the composition 1) to all alkenyl groups in the composition 1) is from 0.25 to 4; preferably from 0.5 to 3.0; more preferably from 0.8 to 2.2; more preferably from >1 to 1.4;
(ii) in case the molar ratio of all SiH groups in the composition 1) to all alkenyl groups in the composition 1) is from >1 to 4,
the molar ratio of the difference:
(molar amount of all SiH-groups in the composition 1)–molar amount of all alkenyl groups in the composition 1))
to
the molar amount of the oxidic filler 1-B) is <0.035, preferably. <0.034, still more preferably <0.033.

Accordingly in the range of the molar ratio of all SiH groups in the composition 1) to all alkenyl groups in the composition 1) from 0.25 to 1 (i.e. alkenyl group excess or equimolar amount of alkenyl groups) there are no limitations as to the amount of the oxidic filler (B). In the range of the molar ratio of all SiH groups in the composition 1) to all alkenyl groups in the composition 1) from >1 to 4 (i.e. SiH excess), a certain amount of the oxidic filler is required in accordance with the definition (ii).

Furthermore the molar ratio of all SiH groups in the composition 1) to all alkenyl groups in the composition 1) shall not exceed 4; preferably shall not exceed 3.0; more preferably shall not exceed 2.2; more preferably it is <1.5.

The adjustments of the molar SiH/Si alkenyl ratios and the amount of the oxidic filler(s) are necessary to achieve the excellent adhesion between the first silicone layer and the second silicone layer, and in particular to provide high-efficacy and high-durable electronic devices e.g. photovoltaic modules comprising the layer structure according to the invention.

For the second layer composition 2) the molar ratio of all SiH groups in the composition 2) to all alkenyl groups in the composition 2) is from >1 to 10, preferably from 1.05 to 10, more preferably from 1.1 to 8, still more preferably from 1.2 to 7. Accordingly there must be a molar excess of the SiH groups in the second curable silicone composition 2). This is also to provide good adhesion to the first curable silicone composition 1), and in particular to provide high-efficacy and high-durable electronic devices e.g. photovoltaic modules comprising the layer structure according to the invention.

Components 1-D and 2-D)

Components 1-D) and 2-D) (in the following simply referred to as component (D)), i.e. 1-D) one or more a metal catalysts, can be the same or different for both silicone compositions, 1) and 2), or layers 1) and 2) formed therefrom respectively. Preferably for both silicone compositions, 1) and 2), or layers 1) and 2) formed therefrom, components 1-D) and 2-D) are the same.

The metal catalysts (D) catalyze the hydrosilylation reaction between components (A) one or more polyorganosiloxanes having at least two alkenyl groups per molecule; and (E) one or more polyorganosiloxanes having at least two SiH groups per molecule. Catalyst component (D) is preferably selected from the group of organo metal compounds, salts or metals, having the ability to catalyze hydrosilylation, wherein the metal is preferably selected from the group of Ni, Ir, Rh, Ru, Os, Pd and Pt. Such compounds are taught for example in U.S. Pat. Nos. 3,159,601; 3,159,662; 3,419,593; 3,715,334; 3,775,452 and 3,814,730. The metal or the organo metal compound can be any catalytically active metal or organo metal compound and is preferably a platinum group metal-containing catalytic active component. Catalysts (D) include in particular complexes with sigma- and pi-bonded carbon ligands as well as ligands with S-, N, or P atoms, metal colloids or salts of the aforementioned metals. The catalysts can be present on a carrier such as silica gel or powdered charcoal, bearing the metal, or a compound or complex of that metal.

Examples of the preferred the platinum complex compounds include any forms of platinum (0), (II) or (IV) compounds. Preferred complexes include Pt-$^{(0)}$-alkenyl complexes, such as of alkenyl, cycloalkenyl, alkenylsiloxane such vinylsiloxane, compounds because of their favorable dispersibility in the polyorganosiloxane compositons. Particularly useful platinum complexes are the Pt$^{(0)}$-complexes with aliphatically unsaturated organosilicon compound such as 1,3-divinyltetramethyldisiloxane (Vinyl-M2 or Karstedt catalyst), as disclosed by U.S. Pat. No. 3,419,593 incorporated herein by reference, cyclohexene-Pt-, cyclooctadien-Pt- and tetravinyltetramethyl-tetracyclosiloxane (Vinyl-D4)-Pt complex compounds. Pt$^0$-olefin complexes are prepared by way of example in the presence of 1,3-divinyltetramethyldisiloxane (M$^{vi}_2$) via reduction of hexachloroplatinic acid or of other platinum chlorides by the way of example by alcohols in the presence of basic compounds such as alkali carbonates or hydroxides. The amount of platinum-containing catalyst component that is used in the compositions of this invention is not narrowly limited as long as there is a sufficient amount to accelerate the hydrosilylation between (A) and (E) at the desired temperature in the required time. The necessary amount of said catalyst component will depend upon the particular catalyst, the amount of other inhibiting compounds and the SiH to Si-alkenyl group ratio and is appropriately adjusted by the skilled person in the art, keeping the amount as low as possible due to cost reasons. Preferably more than one part by weight of platinum for every one million parts by weight of the organosilicon components (A) and (E) are added to ensure curing also in the presence of other undefined inhibiting traces. For the silicone compositions of this invention the amount of a platinum containing catalyst component to be applied is preferably sufficient to provide from 1 to 200 ppm preferably 2 to 100 ppm, especially preferred 4 to 60 ppm by weight platinum per total weight of the polyorganosiloxane components (A) and (E).

Preferably said amount is at least 4 ppm by weight based on the total weight of (A) and (E).

The hydrosilylation catalyst can also be selected from the group of catalysts capable of being photoactivated.

These photo-activatable catalysts preferably contain at least one metal selected from the group composed of Pt, Pd, Rh, Co, Ni, Ir or Ru. The catalysts capable of being photoactivated preferably are platinum compounds. Catalysts capable of being photo-activated are preferably selected among organometallic compounds, i.e. comprise carbon-containing ligands, or salts thereof. In a preferred embodiment photoactive catalyst (D) has metal carbon bonds, including sigma- and pi-bonds. Preferably the catalyst capable of being photo-activated (D) is an organometallic complex compound having at least one metal carbon sigma bond, still more preferably a platinum complex compound having preferably one or more sigma-bonded alkyl and/or aryl group, preferably alkyl group(s). Sigma-bonded ligands include in particular, sigma-bonded organic groups, preferably sigma-bonded $C_1$-$C_6$-alkyl, more preferably sigma-bonded methyl groups, sigma-bonded aryl groups, like phenyl, Si and O substituted sigma bonded alkyl or aryl groups, such as trisorganosilylalkyl groups, sigma-bonded silyl groups, like trialkyl silyl groups. Most preferred photo-activatable catalysts include $\eta^5$-(optionally substituted)-cyclopentadienyl platinum complex compounds having sigma-bonded ligands, preferably sigma-bonded alkyl ligands. Further catalysts capable of being photoactivated include (η-diolefin)-(sigma-aryl)-platinum complexes (see e.g. U.S. Pat. No. 4,530,879). The catalyst capable of being photoactivated can be used as such or supported on a carrier. Examples of photoactivatable catalysts include η-diolefin-σ-aryl-platinum complexes, such as disclosed in U.S. Pat. No. 4,530,879, EP 122008, EP 146307 (corresponding to U.S. Pat. No. 4,510,094 and the prior art documents cited therein), or US 2003/0199603, and also platinum compounds whose reactivity can be controlled by way for example using azodicarboxylic esters, as disclosed in U.S. Pat. No. 4,640,939 or diketonates. Further examples ad platinum compounds having ligands selected from diketones, e.g. benzoylacetones or acetylenedicarboxylic esters, and platinum catalysts embedded into photo-degradable organic resins. Other Pt-catalysts are mentioned by way of example in U.S. Pat. Nos. 3,715,334 or 3,419,593, EP 1 672 031 A1 and Lewis, Colborn, Grade, Bryant, Sumpter, and Scott in Organometallics, 1995, 14, 2202-2213, all incorporated by reference here. Catalysts capable of being photo-activated can also be formed in-situ in the silicone composition to be shaped, by using $Pt^0$-olefin complexes and adding appropriate photo-activatable ligands thereto. The most preferred catalyst capable of being photo-activated to be used in the process of the invention are ($\eta^5$-cyclopentadienyl)-trimethyl-platinum, ($\eta^5$-cyclopentadienyl)-triphenyl-platinum complexes, in particular, ($\eta^5$-methylcyclopentadienyl)-trimethyl-platinum. The amount of the catalyst capable of being photo-activatable is preferably 1 to 500 ppm based on the weight of components (A) and (E) and preferably the amount is in the same lower range as defined for the heat-activatable hydrosilylation catalysts mentioned above.

Components 1-B) and 2-B)-Components 1-C and 2-C)

Components 1-B) and 2-B) and Components 1-C and 2-C) (in the following simply referred to as components (B) and (C), i.e. (B) one or more oxidic fillers and (C) one or more hydrophobing agents, can be the same or different for both silicone compositions, 1) and 2), or layers 1) and 2) formed therefrom respectively. Preferably for both silicone compositions, 1) and 2), or layers 1) and 2) formed therefrom, components (B) and optional component (C) are the same. It should be noted however, that the oxidic filler (B) is a mandatory compound in silicone composition 1) or layers 1) while it is an optional component in silicone composition 2) or layers 2). Preferably, however, both silicone compositions, 1) and 2), or layers 1) and 2) contain the component (B).

The oxidic fillers (B) comprise preferably one or more, if appropriate surface-modified, in particular hydrophobized reinforcing filler. Reinforcing oxidic fillers (B) are preferably characterized by a BET surface area of 50 $m^2$/g or more.

In general, if the curable polyorganosiloxane compositions are irradiation-cured such fillers should be transparent and allow or high light-transmittance.

The fillers include by way of example all of the fine-particle oxidic fillers, i.e. those having particles smaller than 100 μm, preferably they are composed of such particles. Particularly preferred oxidic fillers are silicas, preferably those known as reinforcing silicas, which permit production of elastomers having sufficient transparency for irradiation. Preferred are reinforcing silicas which improve properties of the cured layers after crosslinking, in particular those increasing the strength. Examples are fumed or precipitated silicas whose BET surface areas are from 50 to 400 $m^2$/g. Preferably these fillers are surface-hydrophobicized. Preferably they are used in amounts from 1 to 100 parts by weight, preferably from 5 to 70 parts by weight, even more preferably from 10 to 50 parts by weight, based on 100 parts by weight of the component (A). These amounts apply for both silicone compositions 1) and 2) and the respective layers thereof, while taking into account that the component (B) is an optional component in silicone compositions 2). Specifically oxidic fillers whose BET surface areas are above 50 $m^2$/g, preferably above 80 $m^2$/g, even more preferably above 100 $m^2$/g, even more preferably above 150 $m^2$/g, still more preferably above 200 $m^2$/g, permit the production of cured silicone layers with improved properties. Preferred silicas are, for example, Aerosil® 200, 300, HDK® N20 or T30, Cab-O-Sil® MS7 or HS5 having more than 200 $m^2$/g BET surface area. As BET surface area rises, the transparency of the silicone mixtures in which these materials are present also rises. Examples of trade names of the materials known as precipitated silicas, or wet silicas, are Vulkasil®VN3, or FK 160 from Evonik (formerly Degussa), or Nipsil®LP from Nippon Silica K.K. and others. Silica fillers having BET-surface areas of at least 150 $m^2$/g are particularly suitable for being photo-activated.

The oxidic fillers (B) may be subject to a hydrophobizing treatment with a suitable hydrophobizing or hydrophobing agent (C). The surface treatment of the fillers is preferably a hydrophobation with silanes or with siloxanes. It can by way of example take place in situ via addition of silazanes, such as hexamethyldisilazane and/or 1,3-divinyltetramethyldisilazane, with addition of water, and such an 'in-situ'-hydrophobation is preferred. It can also take place with other known filler-treatment agents like poly-organosiloxanediols whose chain lengths are from 2 to 50 and which bear unsaturated organic radicals, with the aim of providing reactive sites for the crosslinking reaction. Also useable as oxdic filler (B) hydrophobized by reaction with one or more hydrophobing agents (C) are commercially available silicas pre-hydrophobized with various silanes like Aerosil R 972, R 974, R 976, or R 812, or, for example, HDK 2000 or H30 Examples of trade names for materials known as hydrophobized precipitated silicas or wet silicas are e.g. Sipernat D10 or D15 from Evonik (formerly Degussa). Rheological properties, i.e. technical processing properties, of the non-cured silicone rubber mixtures can be influenced by the selection the amount of the type of the filler, its amount, and the nature of hydrophobation.

As described above In case the molar ratio of all SiH groups in the composition 1) to all alkenyl groups in the composition 1) is from >1 to 4, it is necessary in accordance with the present invention that the amount of the oxidic filler (B) in the composition meets the requirement that the molar ratio of the difference: (molar amount of all SiH-groups in the composition 1)–molar amount of all alkenyl groups in the composition 1))

to the molar amount of the oxidic filler 1-B) is <0.035. Working above this range leads to an insufficient adhesion between the two silicone layers.

Further Conventional Auxiliary Additives

The curable polyorganosiloxane compositions 1) and 2) used in the process for the manufacture of the multilayer (preferably two-layer) silicone structure may also comprise conventional auxiliary additives as long as the solution of the object of the invention, i.e. in particular a good adhesion between the two silicone layers, is not affected.

Such auxiliary or conventional additives can comprise for example:

Other filler types (different from the aforementioned oxidic fillers (B), like for examples natural mineral fillers, such as carbonates, and nitrides, pigments, e.g. organic dyes or pigments or inorganic pigments, carbon black, stabilizers against hot air, oils and solvents, process aids, mould release agents, wettings agents, pigments, functional fillers for increased heat or electrical conductivity, low surface or inert fillers so-called extenders for extended volume, solvents, natural or synthetic fibers for reinforcement, blowing agents to initiate foaming, anti-microbial, fungicides or additive for increasing mildew resistance. Other auxiliary or conventional additives further include e.g. plasticizers, or release oils, or hydrophobicizing oils, such as polydimethylsiloxane oils having a viscosity which is preferably 0.001-10 Pa·s at 25° C. Additional mould-release or flow improving agents can also be used, examples being fatty acid derivatives or fatty alcohol derivatives, fluoroalkyl surfactants. Compounds advantageously used here are those, which separate rapidly and migrate to the surfaces. Stability after exposure to hot air can by way of example be increased using known hot-air stabilizers, such as Fe-, Mn-, Ti-, Ce- or La-compounds, and organic salts of these, preferably their organic complexes.

The auxiliary additives may also include so-called inhibitors for controlling the crosslinking reaction. However the presence of those inhibitors is in general not preferred. However, if it is intended to extent the pot-life of the silicone composition to be shaped, for example, in case non-transparent fillers are to be compounded after photo-activation, the use of such inhibitors may be suitable to decrease the cure rate. Examples of advantageous inhibitors generally include ligands of the metal catalyst (D), in particular alkenylsiloxanes such as vinylsiloxanes, 1,3-divinyltetramethyldisiloxane, or tetravinyl-tetramethyl-tetracyclosiloxanes, alkynols, like for example ethynylcyclo-hexanol, 3-methylbutynol, or dimethylmaleate, phospines, phosphites and combinations thereof. Particularly preferred are alkenyl siloxanes in combination with alkynols or phosphites or phosphines.

The conventional auxiliary additives in the curable polyorganosiloxane compositions 1) and 2) further include adhesion promoters, for example selected from (1): at least one organosiloxane, comprising at least one alkoxy silyl group, (2): at least one organosilane, comprising at least one alkoxy silyl group, (3): at least one aromatic organic compound having at least two aromatic moieties and at least one group reactive in hydrosilylation.

Adhesion promoter (1) is preferably an polyorganosiloxane comprising at least one unit selected from the group consisting of $RHSiO_{2/2}$ and
$R^5(R)SiO_{2/2}$, wherein R is as defined above and may be identical or different, $R^5$ is selected from the group consisting of unsaturated aliphatic group with up to 14 carbon atoms, epoxy-group-containing aliphatic group with up to 14 carbon atoms, cyanurate-containing group, and an isocyanurate-containing group, and further comprising at least one unit of the formula:

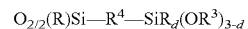
$O_{2/2}(R)Si-R^4-SiR_d(OR^3)_{3-d}$ wherein

R is as defined above and may be identical or different, $R^3$ is selected from H (hydrogen) and alkyl radicals having 1 to 6 carbon atoms, and may be identical or different, $R^4$ is a difunctional optionally substituted hydrocarbyl radical with up to 15 carbon atoms, which may contain one or more heteroatoms selected from O, N and S atoms, and which is bond to the silicon atoms via an Si—C-bond, and d is 0 to 2.

Examples of component (1) include compounds of the formulas (a-d):

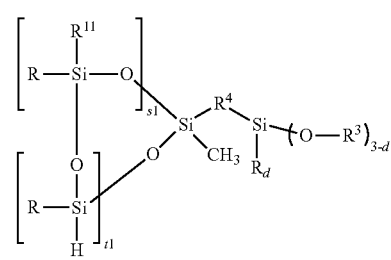

$R^{11}$ is R or $R^5$, wherein R, $R^3$, $R^4$ and $R^5$ are as defined above and may be identical or different, s1=0-6, preferably 1 t1=0-6, preferably 1 or 2 s1+t1=2-6, preferably 2 or 3 with the proviso that there, is at least one group —(OSi(R)H)— or —(OSi(R)(R$^{11}$))— in the compound, preferably a compound of the formula:

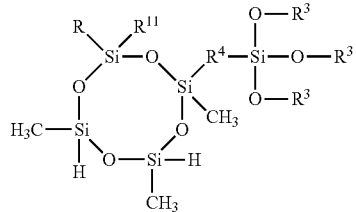

(b)

wherein R, R$^3$, R$^4$ and R$^{11}$ are as defined before, and ring positions isomers thereof, a compound of the formula:

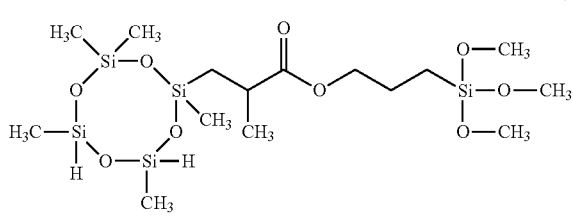

(c)

and ring positions isomers thereof, a compound of the formula.

Furthermore compounds of formula:

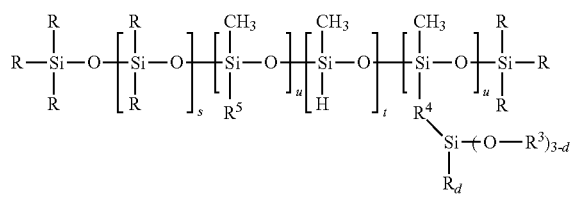

(d)

wherein:
R, R$^3$, R$^4$, R$^5$ are as defined above,
s=0-10 preferably=0-5
t=0-50 preferably=2-30
u=1-10 preferably=1
s+t+u≤70
with the proviso that there is at least one group —(OSi(R)H)— or —(OSi(R)(R$^5$))— in the compound. These compounds may comprise to a certain content Q or T branching groups, replacing the D units.
R$^5$ is for example selected from:

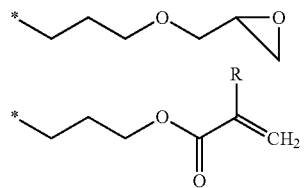

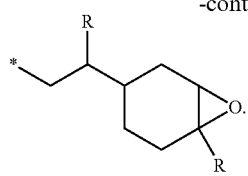

Component (2) is preferably selected from compounds of the following formula:

$$X-(CR^6_2)_e-Y-(CH_2)_e SiR_d(OR^3)_{3-d}$$

wherein
X is selected from the group consisting of halogen, pseudohalogen, unsaturated aliphatic group with up to 14 carbon atoms, epoxy-group-containing aliphatic group with up to 14 carbon atoms, cyanurate-containing group, and an isocyanurate-containing group,
Y is selected from the group consisting of a single bond, a heteroatomic group selected from —COO—, —O—, —S—, —CONH—, —HN—CO—NH—,
R$^6$ is selected from hydrogen and R as defined above,
e is 0, 1, 2, 3, 4, 5, 6, 7, or 8, and may be identical or different,
R is as defined above and may be identical or different,
R$^3$ is as defined above and may be identical or different,
d is 0, 1, or 2.
Preferred examples of component (2) include:

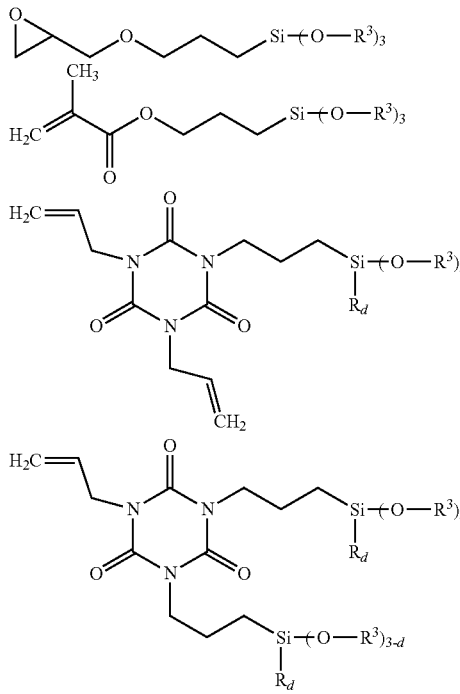

and wherein R and d are as defined above.
Component (2) apart from acting as an adhesion promoter, can serve in addition as in-situ surface treating agent for filler (B). It is preferred to use mixtures of silanes of the component (2) to obtain acceptable adhesion properties at reduced costs.
Component (3) is preferably selected from compounds of the formula:

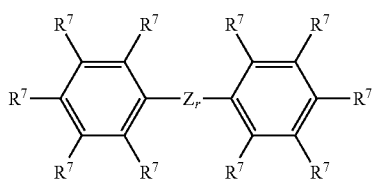

wherein r is 0 or 1, $R^7$ may be the same or different group, which is selected from the group consisting of a hydrogen atom, a hydroxyl group, a halogen atom, an alkyl group, alkenyl group, alkoxy group, alkenyloxy group, alkenylcarbonyloxy group and an aryl group, and a group of formula $-E_f-Si(OR)_{3-d}R_d$, wherein R is identical or different and as defined above, and d is as defined above, a group of formula $-O-Si(R)_2R^1$, wherein R and $R^1$ are as defined above, a group of formula $-E_f-Si(R)_2H$, wherein R is as defined above, wherein E is a divalent organic group with up to 8 carbon atoms and 0 to 3 hetero atomic groups selected from $-O-$, $-NH-$, $C=O$, and $-C(=O)O-$, and f is 0 or 1, and Z is selected from the following groups:

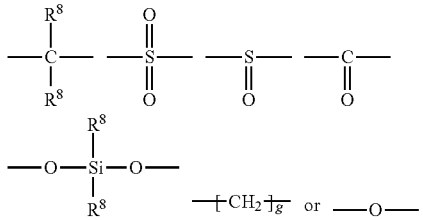

wherein $R^8$ is selected from the group of a hydrogen atom, a halogen atom, or a substituted or unsubstituted alkyl group, aryl group, alkenyl group and alkynyl group, and g is a positive number of at least 2, wherein at least one of the groups selected from $R^7$ and $R^8$ is reactive in hydrosilylation.

Preferred components (3) include:

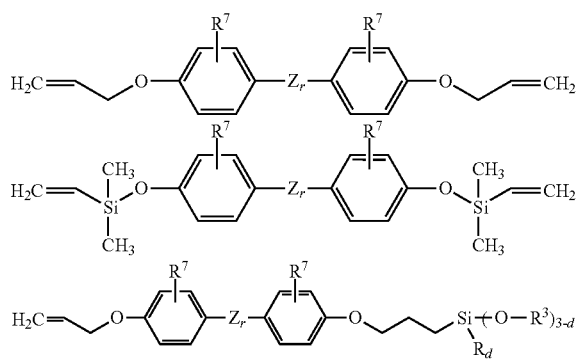

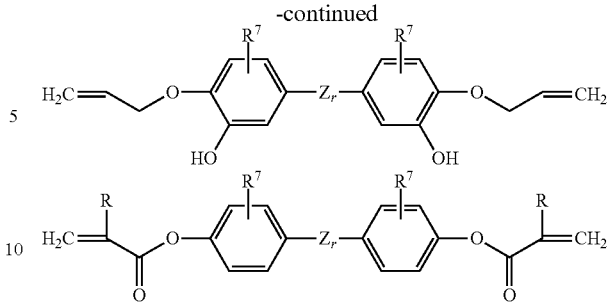

wherein $Z_r$, $R^7$, $R^3$, R and d are each as defined above.

The curable silicone composition 1) and 2) used in the process of the present invention can be prepared by homogeneously mixing components (A) to (E) using suitable mixing means, such as spatula, a drum roller, a mechanical stirrer, a three roll mill, a sigma blade mixer, a dough mixer, a planetary mixer, screws, dissolver, butterfly mixer, press mixer, or a vacuum mixer.

The order of mixing components (A)-(E) is not critical, however, it is preferred that certain components can be mixed to form two or more packages which can be stored, if desired, and then mixed in a final step immediately prior to the intended use thereof.

It is preferred to mix catalyst component (D) and a portion of the components (A), (B) (optionally hydrophobized by the reaction with one or more hydrophobing agents (C)) and optionally one or more of the auxiliaries (like the adhesion promotor) to provide a first package. Separately, components (A), (E), (B) (optionally hydrophobized by the reaction with one or more hydrophobing agents (C)) and optionally one or more auxiliaries are mixed to provide a second package. These two packages can be stored and then homogeneously mixed before use. Other combinations are also possible but it is important not to combine (A), (E) and the catalyst component (D) before use, to avoid the start of the hydrosilylation reaction.

The curable polyorganosiloxane compositions 1) and 2) for the use in the process for the manufacture of a multilayer silicone structure preferably comprise:

100 parts by weight of component (A), 0.1 to 200 parts per weight of component (E), preferably 0.5 to 50 parts by weight, 0.5 to 1000, preferably 1 to 100 ppm of component (D) based on the amount of the metal and based on the total of components (A) and (E), optionally 0 to 5, preferably 0.01 to 5, more preferably from 0.1 to 3 parts by weight of an adhesion promotor, in case of curable polyorganosiloxane compositions 1) 0 to 50 parts by weight of component (2-B), preferably of 0 to 40 parts by weight, and in case of curable polyorganosiloxane compositions 2) 1 to 60 parts by weight of component (1-B), preferably of 5 to 55 parts by weight, and still more preferably 10 to 50 parts by weight;

and optionally 0 to 15 parts, preferably from 0 to 6 parts by weight of other auxiliaries.

The curable polyorganosiloxane compositions 1) and 2) of the present invention can be applied onto the surface of the relevant substrates by any suitable means such as rolling, spreading, spraying, calandering and the like and cured at a suitable temperature. The curing temperature and the time needed will depend in particular upon the specific choice of the catalyst and an optional inhibitor system.

Preferably the heat-curable polyorganosiloxane compositions 1) and 2) are cured between 50 and 120° C. over a period of between 1 and 60 minutes, preferably 5 and 50 minutes, still more preferably 10 to 40 minutes.

With photo-activatable curable polyorganosiloxane compositions 1) and 2) using photo-activatable catalysts or initiators curing is initiated by irradiation with light, in particular UV light having an emission maximum between 300 and 550 nm. Irradiation curing is performed preferably at room temperature (25° C.). According to the invention it is also possible to light-cure the photo-activatable curable polyorganosiloxane compositions and thereafter to heat the compositions to complete curing thermally.

According to the invention it is also possible to use different types for the first and the second curable silicone composition 1) and 2). That is, for example the first curable silicone composition 1) can be cured by heat and the second silicone composition 2) can be cured by irradiation and vice versa. Or both compositions are equally cured by irradiation or by heat, the latter embodiment is the preferred one.

According to the invention it is also possible to apply the first curable silicone composition 1) and to apply—without having cured the first layer, e.g. after short evaporation or drying respectively—the second curable silicone composition 2), and then to finally cure both layers simultaneously (wet-in-wet application). This procedure includes also the embodiment, wherein the first layer is only partially cured before the second layer is applied. Also in this wet-in-wet application process preferably both layers are made of heat curable silicone compositions.

Basically the first layer made from the first curable silicone composition 1) can be applied onto said first substrate to provide any desired thickness. However, in principal one can distinguish two cases.

In the first case the first layer is applied onto the first substrate as a relatively thin primer or adhesive layer. For such a primer layer said first curable silicone composition 1) is for example applied to said first substrate in an amount to provide a dry film thickness of 100 to 1000 μm. Such a layer can be (preferably heat-)cured before the second curable silicone composition 2) is applied. Or the second curable silicone composition 2) is applied onto the first curable silicone composition 1) without being cured (for example just dried or evaporated) and then both layers are (preferably heat-)cured simultaneously (wet-in-wet-curing). In this case one of the preferred substrates is a glass-fibre reinforced epoxy resin, and a particular article made by using the multilayer silicone structure is an electrical insulator.

In such first case the second layer made from the second curable silicone composition 2) can be provided in any desired thickness. For example the second curable silicone composition 2) is applied in an amount to provide a dry film thickness of 100 to 1000 μm (1 mm) or more than 1 mm. Preferably however, the second curable silicone composition 2) is applied to provide a wall thickness of the cured second layer of more than 1 mm, for example more than 2 mm, more than 3 mm, more than 5 mm or even more than 10 mm (1 cm). Wall thickness refers here and in the whole application to the shortest of the three dimensions of the cured layer.

In the second case the first layer is applied onto the first substrate as a relatively thick layer. For such a layer said first curable silicone composition 1) is for example applied to said first substrate in an amount to provide a dry film thickness of more than 1 mm, more than 2 mm, more than 3 mm, more than 5 mm or even more than 10 mm. Such a layer can be (preferably heat or light-)cured, preferably below 100° C., more preferably below 90° C. (light-curing is preferably done below 50°) before the second curable silicone composition 2) is applied. Or the second curable silicone composition 2) is applied onto the first curable silicone composition 1) without being cured (for example just dried or evaporated) and then both layers are (preferably heat-)cured simultaneously (wet-in-wet-curing) preferably cured below 100° C. (e.g. heat curing at 60 to 90° C., or at a lower temperature e.g. below 50° C. by activation through light.

In such second case again the second layer made from the second curable silicone composition 2) can be provided in any desired thickness. For example the second curable silicone composition 2) is applied in an amount to provide a dry film thickness of 100 to 1000 μm (1 mm) or more than 1 mm, more than 2 mm, more than 3 mm, more than 5 mm or even more than 10 mm (1 cm).

In a preferred embodiment of the invention the first curable silicone composition 1) is applied onto the first substrate, and then the first curable silicone composition 1) can be cured or not, e.g. just dried or evaporated. Thereafter one or more electrical components are applied on the surface of said cured or non-cured first curable silicone composition 1). Subsequently the second curable silicone composition 2) is applied thereby covering said one or more electrical components and at least a part or the entire surface of said first curable silicone composition 1), leading to a complete encapsulation of the one or more electrical components. Then the second silicone composition and if not yet cured the first silicone composition are preferably heat-cured below 100° C. (e.g. 60 to 90° C.) or by activation through light at a lower temperature of e.g. below 50° C.

In another preferred embodiment of the present invention the second curable silicone composition 2), before applying to the surface of said first silicone composition 1), is applied on a second substrate, and said second curable silicone composition 2) coated on the second substrate, is applied to the surface of said first silicone composition 1), and thereafter curing of said second curable silicone composition 2), optionally together with said first curable silicone composition 1) is carried out, leading to a multilayer structure having two substrates bonded via the cured first and cured second silicone compositions 1) and 2) between said two substrates.

According to the process of the invention the first silicone composition 1) and said second curable silicone composition 2) may have the same or different compositions. From the standpoint of ease of application the silicone compositions are preferably the same for both layers. In a preferred embodiment, however, the second layer composition has a higher molar SiH/Si-alkenyl group ratio than the first layer composition.

Suitable first substrates upon which the first silicone composition 1) can be applied include in particular semiconductor materials, for example silicone wafers; plastics, metals, ceramics, and glass. In a particularly preferred embodiment the first substrate is selected from glass and glass-fibre reinforced plastic, for example glass-fibre reinforced epoxy resins. The same applies to the second substrate, if a multilayer structure of the type:

First substrate/First Silicone Layer/Second Silicone Layer/Second Substrate is produced.

In accordance with the present invention the multi-layer silicone structure is used preferably for the manufacture of electronic devices, coatings in particular in solar cell modules, any type of shaped molded articles, laminates, impression materials. In a particular preferred process of the invention the multi-layer silicone structure are selected from encapsulated or embedded electronic devices, which are most preferably selected from the group, consisting of encapsulated or embedded solar cell modules, encapsulated or embedded integrated circuits; electrical insulators, encapsulated or embedded LEDs, intermediate layers of displays, monitors or screens.

The present invention in a further aspect relates to the use of a first curable silicone composition 1) and a second curable silicone composition 2) applied onto said first curable silicone composition 1), each as defined before, for coating or encapsulating of electrical components, in particular for the manufacture of solar cell modules and electrical insulators.

The present invention in a further aspect relates to a multilayer silicone structure obtained by the process as defined above. A particular preferred multilayer silicone structure according to the invention is a solar cell module or a photovoltaic device, respectively, or an electrical insulator. A usual solar cell module in accordance with the present invention may consist of a front glass superstrate, semiconductor cells (wafer or thin film), conductive lines, a substrate or backskin, and encapsulants that may partly or completely encapsulate the semiconductor cells, such encapsulants are formed from the multilayer silicone structure according to the invention. In addition the solar cell module in accordance with the present invention may comprise a support frame, preferably made from metal, e.g. aluminum. In a preferred embodiment of the present invention the cured silicone encapsulants together with the glass superstrate forms a closed space comprising the semiconductor cells. This embodiment may either include that the semiconductor cells are completely embedded in the cured silicone encapsulants that are in contact with the glass superstrate, or include that the cured silicone encapsulants and the glass superstrate, comprising the semiconductor cells, form an interspace. In a further preferred embodiment, the interspace formed by the cured silicone encapsulants and the glass superstrate does not comprise any other material than the semiconductor cells and the conductive lines. In a further preferred embodiment the solar cell module in accordance with the present invention has an outer backskin that has preferably a high glass transition temperature, such as more than 120° C. The backskin substrate is a rigid or stiff backskin to provide protection to the rear surface of the module. A wide variety of materials have been proposed for such a substrate, which does not necessarily need to be transparent to light They include materials such as glass, organic fluoropolymers such as ethylene tetrafluoroethylene (ETFE), Tedlar, or polyethylene terephthalate (PET) alone or coated with silicon and oxygen based materials (SiOx), PVDF (polyvinylidene fluoride), PVF (polyvinylfluoride), multilayer materials like PVF-PET-PVF, or EVA copolymers although less preferred due to lower degradation resistance. The outer backskin layer as described before is preferably in contact with the cured silicone encapsulants forming the multilayer silicone structure according to the invention. As explained above the cured silicone encapsulants at the same time provide excellent and durable adhesion to a glass superstrate and a backskin layer of a solar cell module, in particular a fluoro thermoplast sheet as backskin layer, and at the same time have excellent adhesion to each other forming a rigid multilayer silicone structure according to the invention. The curable polyorganosiloxane composition 1) in a preferred embodiment of a solar cell module is in contact with glass.

In the following passages the term "solar cell" includes a semiconductor cell plus its interconnectors or electrical leads and could be also referred to a connected matrix of plural semiconductor cells.

Particular preferred processes for the manufacture of a photovoltaic device or a solar cell module, are selected from processes (A) to (C) as described in the following:

Process (A) comprises the steps of:
(a) providing a substrate,
(b) applying said first curable silicone composition 1) onto the surface of the substrate,
(c) providing at least one solar cell onto the surface of said first curable silicone composition 1),
(d) optionally curing said first curable silicone composition 1),
(e) applying said second curable silicone composition 2) onto the surface of the layer formed of the first curable silicone composition 1) and to the surface of the solar cells,
(f) optionally applying a back sheet (such as the above mentioned backskin substrates (e.g. glass or plastics)) onto the surface of the structure obtained in step (e),
(g) curing said second curable silicone composition 2) optionally together with said first curable silicone composition 1)

These steps are preferably carried out in the order (a), (b), (c) . . . and (g) but may also deviate from said order. According to said process (A) at first a substrate is provided, which is preferably a transparent glass substrate, like a front glass superstrate. Then the first curable silicone composition 1) is applied. Solar cells, like semiconductor cells (wafer or thin film) are provided onto said first curable silicone composition 1). Optionally the first silicone composition 1) is then cured. (It is however also possible to first cure the first silicone composition 1) and then to apply or mount the solar cells onto the cured first silicone composition 1)). A laminate comprising the substrate, the solar cells and the first silicone layer 1) is obtained. The laminate can be such that the solar cells are already encapsulated completely by the first silicone composition, or the solar cells are only partly encapsulated or embedded in the first silicone composition. In any case the solar cells are finally fixed to the substrate by the first silicone composition. Onto such laminate the second curable silicone composition 2) is applied preferably in a flow or dropwise to the surface of the layer formed of the first curable silicone composition 1) and to the surface of the solar cells if they are not covered completely already by the first silicone composition 1). Optionally then a back sheet (such as the above mentioned back skin substrates) is applied onto the surface of the structure obtained after applying the second silicone layer, preferably onto the entire surface thereof. Finally the second curable silicone composition 2) is cured, optionally together with said first curable silicone composition 1) to obtain a laminate structure having a front substrate, preferably a front glass superstrate, solar cells embedded or encapsulated by said first silicone layer having said second silicone layer thereupon and having preferably a back sheet or back skin material such as the above mentioned backskin substrates (e.g. glass or plastics) thereupon.

Process (B) comprises the steps of:
(a) providing a substrate,
(b) applying said first curable silicone composition 1) to the surface of the substrate,
(c) providing at least one solar cell onto the surface of the first curable silicone composition 1), (d) optionally curing said first curable silicone composition 1),
(e) applying said second curable silicone composition 2) to the surface of a second substrate, preferably a back sheet or back skin material (such as the above mentioned backskin substrates (e.g. glass or plastics));
(f) applying said back sheet with the layer of the second curable silicone composition 2) to the surface of the layer of the first curable silicone composition 1) to bring the first and second layers of the curable silicone compositions into contact with each other,
(g) curing said second curable silicone composition 2) optionally together with said first curable silicone composition 1).

Again these steps are preferably carried out in the order (a), (b), (c) . . . and (g) but may also deviate from said order. According to said process (B) at first a substrate is provided, which is preferably a transparent glass substrate, like a front glass superstrate. Then the first curable silicone composition 1) is applied. Solar cells, like semiconductor cells (wafer or thin film) are provided on said first curable silicone composition 1). Optionally the first silicone composition is then cured. (It is however also possible to first cure the first silicone composition 1) and then to apply or mount the solar cells onto the cured first silicone composition 1)). Thus a first laminate comprising the substrate, solar cells and the first silicone layer is obtained. The laminate can be such that the solar cells are already encapsulated completely by the first silicone composition, or the solar cells are only partly encapsulated or embedded in the first silicone composition. In any case the solar cells are finally fixed to the substrate by the first silicone composition. Then a second laminate is formed by applying the second curable silicone composition 2) onto the surface of a back sheet (such as the above mentioned backskin substrates (e.g. glass or plastics)). Such second laminate is then applied onto the surface of the first silicone layer of the first laminate. Finally the second curable silicone composition 2) is cured, optionally together with said first curable silicone composition 1) to thereby adhere the first laminate to the second laminat. Again a multilayer structure is obtained having a front substrate, preferably a front glass superstrate, solar cells embedded or encapsulated by said first silicone layer having said second silicone layer thereupon and having a back sheet or back skin material (such as the above mentioned backskin substrates (e.g. glass or plastics)) thereupon.

Process (C) comprises the steps of:
(a) providing solar cells, preferably in a kind of frame, mould or on a workpiece holder, preferably connected by conductive lines,
(b) applying said first curable silicone composition 1) onto the solar cells,
(c) providing a substrate on the surface of the layer of said first curable silicone composition 1),
(d) curing said first curable silicone composition 1),
(e) applying a second curable silicone composition 2) onto the surface of the layer of the first silicone composition 1),
(f) optionally applying a back sheet (such as the above mentioned backskin substrates (e.g. glass or plastics)) onto the layer of said second curable silicone composition 2),
(g) curing said second curable silicone composition 2).

Again these steps are preferably carried out in the order (a), (b), (c) . . . and (g) but may also deviate from said order. In this embodiment first one or preferably more solar cells are provided for example in a kind of frame or mould. The solar cells are preferably connected by conductive lines. Then the first curable silicone composition 1) is applied onto the solar cells. Thereby the solar cells are encapsulated completely, or the solar cells are only partly encapsulated or embedded in the first silicone composition. In the next step preferably in a continuous process a substrate, preferably a transparent glass superstrate is applied on to the surface of the first curable silicone composition 1) having the solar cells embedded or encapsulated therein. The application of the transparent glass superstrate is preferably carried out by continuously bending a glass sheet onto the surface of the layer of said first curable silicone composition 1). Then the curable silicone composition 1) is cured thereby adhering the glass sheet to the cured silicone layer 1). The resulting laminate comprising the glass superstrate and the cured first silicone layer having embedded or encapsulated therein the solar cells is then preferably turned upside down. Then the a second curable silicone composition 2) is preferably continuously applied onto the surface of the cured layer of the first silicone composition 1). Optionally thereafter a back sheet (such as the above mentioned backskin substrates (e.g. glass or plastics)) is applied (preferably rolled) onto the second curable silicone layer. Finally the second silicone layer is cured thereby forming a laminate structure comprising a transparent substrate, onto which a multilayer silicone structure according to the invention is formed, comprising encapsulated solar cells and having optionally a back skin layer (such as the above mentioned backskin substrates (e.g. glass or plastics)).

The following briefly summarizes the most preferred methods of manufacturing a photovoltaic device in accordance with the present invention:

First Method:
1)—A glass substrate is coated with the first curable silicone composition 1) in a defined thickness.
2)—Then a plurality of interconnected solar cells is put on top of that wet first silicone layer 1)
3)—The silicone layer 1) might be optionally cured.
4)—On top of that first structure (solar cells and first silicone layer 1)) the second curable silicone composition 2) is preferably applied in a pattern, a big drop or a uniform thickness.
5)—Then a back sheet is put on top of that in a way that the second silicone layer 2) builds a uniform thick layer
6)—The second layer is then cured, optionally together with the first silicone layer.

Second Method:
1)—A Glass Substrate is Coated with the First Curable Silicone Composition 1) in a defined thickness.
2)—The a plurality of interconnected solar cells is put on top of that wet first silicone layer 1)
3)—The silicone layer 1) might be optionally cured.
4)—The back sheet is coated in the same way with a second curable silicone composition 2) in a defined thickness.
5)—Both structures are combined and then cured, optionally together with the first silicone composition 1).

Third Method:
1)—Solar cells are provided in a mold or interconnected on a workpiece holder.
2) The first curable silicone composition 1) is applied onto the cells.
3) Then a glass substrate is bend onto the silicone layer 1) to reach a uniform thickness,
4) The first silicone layer is cured.
5) The structure obtained is flipped onto the glass side.

6) The second silicone composition 2) is applied onto the structure with first silicone layer 1) and solar cells.
7) A back sheet is rolled onto the second silicone composition 2) to reach uniform thickness.
8) Then the second silicone composition 2) is cured.

In a particular preferred method of manufacturing a photovoltaic device in accordance with the present invention the first silicone layer 1) is cured before the solar cells are mounted on the surface of the cured first silicone layer and thereafter the second silicone layer is applied.

A particular preferred solar cell or photovoltaic device manufactured by the process of the invention has a front glass superstrate (first substrate) and a second back skin substrate, which can be also made of glass. In this embodiment the thicknesses of the glass substrates should be relatively small concerning the weight of the photovoltaic device.

The process of manufacturing the multilayer silicone structure according to the invention in particular of manufacturing the solar cell modules comprising the multilayer silicone structure according to the invention can be carried out continuously or discontinuously (batchwise), preferably continuously.

The present invention is explained in more detail in the following examples.

EXAMPLES

Test Procedure for Silicone Laminate Adhesion

Procedure: A Teflon-coated mold was filled with 2 mm thickness silicone encapsulant as first layer. Then it was placed in an oven for 30 minutes, which has been pre-heated to 80° C. The specimens are stored under ambient conditions for at least 12 hours before a second silicone encapsulant layer was placed on top of the first one in a 2 mm thick frame. Again the mold was placed for 30 minutes in a 80° C. pre-heated oven. After one week at room temperature the samples were removed from the mold and manually tested for adhesive or cohesive laminate adhesion. If the sample showed cohesive failure (layers are almost destroyed while trying to separate the layers), the layer-to-layer adhesion was strong and the composition is suitable to provide adhesion in a two-step curing process in particular in the manufacture of solar cell modules. Weak adhesion is shown by samples with adhesive failures (The layers remained essentially intact while trying to separate them). Such compositions were not suitable, in particular, for the usage in the manufacture of solar cell modules which were made by a two-step curing process.

Base Compound Filler Batch:

A filler batch was produced as follows: 22.5 kg of a vinyl terminated linear polydimethylsiloxane with a viscosity of 10 Pa s at 25° C. was placed in a planetary mixer and mixed with 2.8 kg of hexamethyldisilazane and 0.9 kg of water. 12.0 kg of fumed silica with a BET surface of 300 m$^2$/g were gradually added and mixed in until a stiff mixture was obtained. This mixture was stirred and heated to reflux for 30 minutes. The volatiles were distilled off and subsequently vacuum was pulled for 30 minutes. The mixture was diluted with 7.8 kg of the above polydimethyl-siloxane. When the resulting filler batch was used for the preparation of the following encapsulants it was calculated as having 28.3 wt-% of silica and 71.7 wt-% of vinyl terminated polymer with a viscosity of 10 Pa s at 25° C.

Example 1

First Layer:
A component: 16 g of base compound filler batch, 33.88 g vinyl terminated linear polydimethylsiloxane with a viscosity of 10 Pa s at 25° C., 0.12 g of a platinum solution of the Karstedt type with 1 % of platinum and 41.3 μl ethinylcyclohexanol were thoroughly mixed.
B component: 16 g of base compound filler batch, 33.61 g vinyl terminated linear polydimethylsiloxane with a viscosity of 10 Pa s at 25° C. and 0.39 g of cross linker ($M_2D^H{}_{26}$) were mixed thoroughly.
Component A and B were mixed in a ratio of 1:1 and filled into a 2 cm*5 cm*2 mm mold. The layer was cured in an oven at 80° C. for 30 minutes.

Second Layer:
A component: same as for first layer.
B component: same as for first layer.
Component A and B were mixed in a ratio of 1:1 and filled on top of the first layer into a 2 cm*5 cm*2 mm frame. The layer was cured in an oven at 80° C. for 30 minutes. After one week the laminate was removed from the frame and the mold. The adhesion was tested manually. The sample showed uniformly cohesive failure, i.e. complete destruction occurs while trying to separate them.

The following table summarizes the relevant parameters of the compositions of the two layers:

| Layer | SiH Excess[1] [mmol/100 g] | Silica [mmol/100 g] | SiH:SiVi | SiH Excess: Silica[2] |
|---|---|---|---|---|
| 1st | 1.44 | 150 | 1.3 | 0.0096 |
| 2nd | 1.44 | 150 | 1.3 | 0.0096 |

[1] difference (molar amount of all SiH-groups − molar amount of all alkenyl groups in the composition) in mmol/100 g
[2] ratio molar SiH Excess/molar amount of silica.

Example 2

First Layer:
A component: 16 g of base compound filler batch, 33.88 g vinyl terminated linear polydimethylsiloxane with a viscosity of 10 Pa s at 25° C., 0.12 g of a platinum solution of the Karstedt type with 1 % of platinum and 41.3 μl ethinylcyclohexanol were thoroughly mixed.
B component: 16 g of base compound filler batch, 33.40 g vinyl terminated linear polydimethylsiloxane with a viscosity of 10 Pa s at 25° C. and 0.6 g of cross linker ($M_2D^H{}_{26}$) were mixed thoroughly.
Component A and B were mixed in a ratio of 1:1 and filled into a 2 cm*5 cm*2 mm mold. The layer was cured in an oven at 80° C. for 30 minutes.

Second Layer:
A component: 30 g of base compound filler batch, 19.88 g vinyl terminated linear polydimethylsiloxane with a viscosity of 10 Pa s at 25° C., 0.12 g of a platinum solution of the Karstedt type with 1 % of platinum and 41.3 μl ethinylcyclohexanol were thoroughly mixed.
B component: 30 g of base compound filler batch, 19.64 g vinyl terminated linear polydimethylsiloxane with a viscosity of 10 Pa s at 25° C. and 0.36 g of cross linker ($M_2D^H{}_{26}$) were mixed thoroughly.
Component A and B were mixed in a ratio of 1:1 and filled on top of the first layer into a 2 cm*5 cm*2 mm frame. The layer was cured in an oven at 80° C. for 30 minutes. After one week the laminate was removed from the frame and the mold. The adhesion was tested manually. The sample showed uniformly cohesive failure.

The following table summarizes the relevant parameters of the compositions of the two layers:

| Layer | SiH Excess[1] [mmol/100 g] | Silica [mmol/100 g] | SiH:SiVi | SiH Excess: Silica[2] |
|---|---|---|---|---|
| 1st | 4.77 | 150 | 2 | 0.0318 |
| 2nd | 1.38 | 282.36 | 1.3 | 0.0049 |

[1]difference (molar amount of all SiH-groups − molar amount of all alkenyl groups in the composition) in mmol/100 g
[2]ratio molar SiH Excess/molar amount of silica Example 3

First Layer:
A component: 23 g of base compound filler batch, 26.88 g vinyl terminated linear polydimethylsiloxane with a viscosity of 10 Pa s at 25° C., 0.12 g of a platinum solution of the Karstedt type with 1 % of platinum and 41.3 µl ethinylcyclohexanol were thoroughly mixed.
B component: 23 g of base compound filler batch, 26.43 g vinyl terminated linear polydimethylsiloxane with a viscosity of 10 Pa s at 25° C. and 0.57 g of cross linker ($M_2D^H{}_{26}$) were mixed thoroughly.

Component A and B were mixed in a ratio of 1:1 and filled into a 2 cm*5 cm*2 mm mold. The layer was cured in an oven at 80° C. for 30 minutes.

Second Layer:
A component: 23 g of base compound filler batch, 26.88 g vinyl terminated linear polydimethylsiloxane with a viscosity of 10 Pa s at 25° C., 0.12 g of a platinum solution of the Karstedt type with 1 % of platinum and 41.3 µl ethinylcyclohexanol were thoroughly mixed.
B component: 23 g of base compound filler batch, 25.87 g vinyl terminated linear polydimethylsiloxane with a viscosity of 10 Pa s at 25° C. and 1.13 g of cross linker ($M_2D^H{}_{26}$) were mixed thoroughly.

Component A and B were mixed in a ratio of 1:1 and filled on top of the first layer into a 2 cm*5 cm*2 mm frame. The layer was cured in an oven at 80° C. for 30 minutes. After one week the laminate was removed from the frame and the mold. The adhesion was tested manually. The sample showed uniformly cohesive failure.

The following table summarizes the relevant parameters of the compositions of the two layers:

| Layer | SiH Excess[1] [mmol/100 g] | Silica [mmol/100 g] | SiH:SiVi | SiH Excess: Silica[2] |
|---|---|---|---|---|
| 1st | 4.5 | 216.47 | 2 | 0.0208 |
| 2nd | 13.38 | 216.47 | 4 | 0.0618 |

[1]difference (molar amount of all SiH-groups − molar amount of all alkenyl groups in the composition) in mmol/100 g
[2]ratio molar SiH Excess/molar amount of silica Example 4

First Layer:
A component: 30 g of base compound filler batch, 19.88 g vinyl terminated linear polydimethylsiloxane with a viscosity of 10 Pa s at 25° C., 0.12 g of a platinum solution of the Karstedt type with 1 % of platinum and 41.3 µl ethinylcyclohexanol were thoroughly mixed.
B component: 30 g of base compound filler batch, 19.64 g vinyl terminated linear polydimethylsiloxane with a viscosity of 10 Pa s at 25° C. and 0.36 g of cross linker ($M_2D^H{}_{26}$) were mixed thoroughly.

Component A and B were mixed in a ratio of 1:1 and filled into a 2 cm*5 cm*2 mm mold. The layer was cured in an oven at 80° C. for 30 minutes.

Second Layer:
A component: 30 g of base compound filler batch, 19.88 g vinyl terminated linear polydimethylsiloxane with a viscosity of 10 Pa s at 25° C., 0.12 g of a platinum solution of the Karstedt type with 1 % of platinum and 41.3 µl ethinylcyclohexanol were thoroughly mixed.
B component: 30 g of base compound filler batch, 18.92 g vinyl terminated linear polydimethylsiloxane with a viscosity of 10 Pa s at 25° C. and 1.08 g of cross linker ($M_2D^H{}_{26}$) were mixed thoroughly.

Component A and B were mixed in a ratio of 1:1 and filled on top of the first layer into a 2 cm*5 cm*2 mm frame. The layer was cured in an oven at 80° C. for 30 minutes. After one week the laminate was removed from the frame and the mold. The adhesion was tested manually. The sample showed uniformly cohesive failure.

The following table summarizes the relevant parameters of the compositions of the two layers:

| Layer | SiH Excess[1] [mmol/100 g] | Silica [mmol/100 g] | SiH:SiVi | SiH Excess: Silica[2] |
|---|---|---|---|---|
| 1st | 1.38 | 282.36 | 1.3 | 0.0049 |
| 2nd | 12.79 | 282.36 | 4 | 0.0453 |

[1]difference (molar amount of all SiH-groups − molar amount of all alkenyl groups in the composition) in mmol/100 g
[2]ratio molar SiH Excess/molar amount of silica Example 5

Comparison

First Layer:
A component: 16 g of base compound filler batch, 33.88 g vinyl terminated linear polydimethylsiloxane with a viscosity of 10 Pa s at 25° C., 0.12 g of a platinum solution of the Karstedt type with 1 % of platinum and 41.3 µl ethinylcyclohexanol were thoroughly mixed.
B component: 16 g of base compound filler batch, 32.82 g vinyl terminated linear polydimethylsiloxane with a viscosity of 10 Pa s at 25° C. and 1.18 g of cross linker ($M_2D^H{}_{26}$) were mixed thoroughly.

Component A and B were mixed in a ratio of 1:1 and filled into a 2 cm*5 cm*2 mm mold. The layer was cured in an oven at 80° C. for 30 minutes.

Second Layer:
A component: 16 g of base compound filler batch, 33.88 g vinyl terminated linear polydimethylsiloxane with a viscosity of 10 Pa s at 25° C., 0.12 g of a platinum solution of the Karstedt type with 1 % of platinum and 41.3 µl ethinylcyclohexanol were thoroughly mixed.
B component: 16 g of base compound filler batch, 32.82 g vinyl terminated linear polydimethylsiloxane with a viscosity of 10 Pa s at 25° C. and 1.18 g of cross linker ($M_2D^H{}_{26}$) were mixed thoroughly.

Component A and B were mixed in a ratio of 1:1 and filled on top of the first layer into a 2 cm*5 cm*2 mm frame. The layer was cured in an oven at 80° C. for 30 minutes. After one week the laminate was removed from the frame and the mold. The adhesion was tested manually. The sample showed only adhesive failure.

The following table summarizes the relevant parameters of the compositions of the two layers:

| Layer | SiH Excess[1] [mmol/100 g] | Silica [mmol/100 g] | SiH:SiVi | SiH Excess: Silica[2] |
|---|---|---|---|---|
| 1st | 13.97 | 150.00 | 4 | 0.0931 |
| 2nd | 13.97 | 150.00 | 4 | 0.0931 |

[1]difference (molar amount of all SiH-groups − molar amount of all alkenyl groups in the composition) in mmol/100 g
[2]ratio molar SiH Excess/molar amount of silica

Example 6

Comparison

First Layer:
A component: 23 g of base compound filler batch, 26.88 g vinyl terminated linear polydimethylsiloxane with a viscosity of 10 Pa s at 25° C., 0.12 g of a platinum solution of the Karstedt type with 1 % of platinum and 41.3 μl ethinylcyclohexanol were thoroughly mixed.
B component: 23 g of base compound filler batch, 25.87 g vinyl terminated linear polydimethylsiloxane with a viscosity of 10 Pa s at 25° C. and 1.13 g of cross linker ($M_2D^H_{26}$) were mixed thoroughly.
Component A and B were mixed in a ratio of 1:1 and filled into a 2 cm*5 cm*2 mm mold. The layer was cured in an oven at 80° C. for 30 minutes.
Second Layer:
A component: 23 g of base compound filler batch, 26.88 g vinyl terminated linear polydimethylsiloxane with a viscosity of 10 Pa s at 25° C., 0.12 g of a platinum solution of the Karstedt type with 1 % of platinum and 41.3 μl ethinylcyclohexanol were thoroughly mixed.
B component: 23 g of base compound filler batch, 26.43 g vinyl terminated linear polydimethylsiloxane with a viscosity of 10 Pa s at 25° C. and 0.57 g of cross linker ($M_2D^H_{26}$) were mixed thoroughly.
Component A and B were mixed in a ratio of 1:1 and filled on top of the first layer into a 2 cm*5 cm*2 mm frame. The layer was cured in an oven at 80° C. for 30 minutes. After one week the laminate was removed from the frame and the mold. The adhesion was tested manually. The sample showed only adhesive failure.

The following table summarizes the relevant parameters of the compositions of the two layers:

| Layer | SiH Excess[1] [mmol/100 g] | Silica [mmol/100 g] | SiH:SiVi | SiH Excess: Silica[2] |
|---|---|---|---|---|
| 1st | 13.38 | 216.47 | 4 | 0.0618 |
| 2nd | 4.5 | 216.47 | 2 | 0.0208 |

[1]difference (molar amount of all SiH-groups − molar amount of all alkenyl groups in the composition) in mmol/100 g
[2]ratio molar SiH Excess/molar amount of silica

Example 7

Comparison

First Layer:
A component: 30 g of base compound filler batch, 19.88 g vinyl terminated linear polydimethylsiloxane with a viscosity of 10 Pa s at 25° C., 0.12 g of a platinum solution of the Karstedt type with 1 % of platinum and 41.3 μl ethinylcyclohexanol were thoroughly mixed.
B component: 30 g of base compound filler batch, 18.92 g vinyl terminated linear polydimethylsiloxane with a viscosity of 10 Pa s at 25° C. and 1.08 g of cross linker ($M_2D^H_{26}$) were mixed thoroughly.
Component A and B were mixed in a ratio of 1:1 and filled into a 2 cm*5 cm*2 mm mold. The layer was cured in an oven at 80° C. for 30 minutes.
Second Layer:
A component: 30 g of base compound filler batch, 19.88 g vinyl terminated linear polydimethylsiloxane with a viscosity of 10 Pa s at 25° C., 0.12 g of a platinum solution of the Karstedt type with 1 % of platinum and 41.3 μl ethinylcyclohexanol were thoroughly mixed.
B component: 30 g of base compound filler batch, 19.64 g vinyl terminated linear polydimethylsiloxane with a viscosity of 10 Pa s at 25° C. and 0.36 g of cross linker ($M_2D^H_{26}$) were mixed thoroughly.
Component A and B were mixed in a ratio of 1:1 and filled on top of the first layer into a 2 cm*5 cm*2 mm frame. The layer was cured in an oven at 80° C. for 30 minutes. After one week the laminate was removed from the frame and the mold. The adhesion was tested manually. The sample showed only adhesive failure.

The following table summarizes the relevant parameters of the compositions of the two layers:

| Layer | SiH Excess[1] [mmol/100 g] | Silica [mmol/100 g] | SiH:SiVi | SiH Excess: Silica[2] |
|---|---|---|---|---|
| 1st | 12.79 | 282.36 | 4 | 0.0453 |
| 2nd | 1.38 | 282.36 | 1.3 | 0.0049 |

[1]difference (molar amount of all SiH-groups − molar amount of all alkenyl groups in the composition) in mmol/100 g
[2]ratio molar SiH Excess/molar amount of silica

Example 8

First Layer:
A component: 23 g of base compound filler batch, 26.88 g vinyl terminated linear polydimethylsiloxane with a viscosity of 10 Pa s at 25° C., 0.12 g of a platinum solution of the Karstedt type with 1% of platinum and 41.3 μl ethinylcyclohexanol were thoroughly mixed.
B component: 23 g of base compound filler batch, 24.55 g vinyl terminated linear polydimethylsiloxane with a viscosity of 10 Pa s at 25° C., 0.75 g of 3-Methacryloxy-propyltrimethoxysilane, 1 g SiH containing adhesion promoter of the formula:

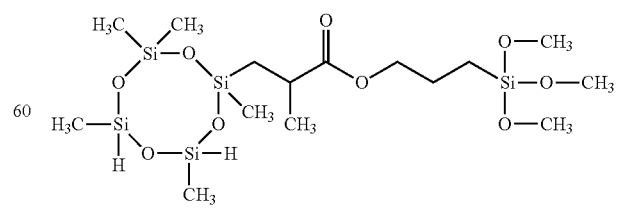

(3.78 mmol SiH/g) and 0.7 g of cross linker ($M_2D^H_{26}$) were mixed thoroughly.

Component A and B were mixed in a ratio of 1:1 and filled into a 2 cm*5 cm*2 mm mold. A sheet of wire was placed into the liquid silicone. The layer was cured in an oven at 80° C. for 30 minutes.

Second Layer:

A component: 30 g of base compound filler batch, 19.88 g vinyl terminated linear polydimethylsiloxane with a viscosity of 10 Pa s at 25° C., 0.12 g of a platinum solution of the Karstedt type with 1 % of platinum and 41.3 µl ethinylcyclohexanol were thoroughly mixed.

B component: 30 g of base compound filler batch, 16.67 g vinyl terminated linear polydimethylsiloxane with a viscosity of 10 Pa s at 25° C., 0.75 g of 3-Methacryloxypropyltrimethoxysilane, 1 g SiH containing adhesion promoter (3.78 mmol SiH/g—same as above) and 1.58 g of cross linker ($M_2D^H{}_{26}$) were mixed thoroughly. Component A and B were mixed in a ratio of 1:1 and filled on top of the first layer into a 2 cm*5 cm*2 mm frame. A sheet of wire was placed into the liquid silicone. The layer was cured in an oven at 80° C. for 30 minutes. After one day the laminate was removed from the frame and the mold. The adhesion was tested by peel adhesion and showed cohesive failure.

The following table summarizes the relevant parameters of the compositions of the two layers:

| Layer | SiH Excess[1] [mmol/100 g] | Silica [mmol/100 g] | SiH:SiVi | SiH Excess: Silica[2] |
|---|---|---|---|---|
| 1st | 6.66 | 216.31 | 2 | 0.0308 |
| 2nd | 20.81 | 282.86 | 4 | 0.0736 |

[1]difference (molar amount of all SiH-groups − molar amount of all alkenyl groups in the composition) in mmol/100 g
[2]ratio molar SiH Excess/molar amount of silica Example 9

Comparison

First Layer:

A component: 30 g of base compound filler batch, 19.88 g vinyl terminated linear polydimethylsiloxane with a viscosity of 10 Pa s at 25° C., 0.12 g of a platinum solution of the Karstedt type with 1 % of platinum and 41.3 µl ethinylcyclohexanol were thoroughly mixed.

B component: 30 g of base compound filler batch, 16.67 g vinyl terminated linear polydimethylsiloxane with a viscosity of 10 Pa s at 25° C., 0.75 g of 3-Methacryloxypropyltrimethoxysilane, 1 g SiH containing adhesion promoter (3.78 mmol SiH/g—same as above) and 1.58 g of cross linker ($M_2D^H{}_{26}$) were mixed thoroughly. Component A and B were mixed in a ratio of 1:1 and filled into a 2 cm*5 cm*2 mm mold. A sheet of wire was placed into the liquid silicone. The layer was cured in an oven at 80° C. for 30 minutes.

Second Layer:

A component: 30 g of base compound filler batch, 19.88 g vinyl terminated linear polydimethylsiloxane with a viscosity of 10 Pa s at 25° C., 0.12 g of a platinum solution of the Karstedt type with 1 % of platinum and 41.3 µl ethinylcyclohexanol were thoroughly mixed.

B component: 30 g of base compound filler batch, 17.89 g vinyl terminated linear polydimethylsiloxane with a viscosity of 10 Pa s at 25° C., 0.75 g of 3-Methacryloxypropyltrimethoxysilane, 1 g SiH containing adhesion promoter (3.78 mmol SiH/g—same as above) and 0.36 g of cross linker ($M_2D^H{}_{26}$) were mixed thoroughly. Component A and B were mixed in a ratio of 1:1 and filled on top of the first layer into a 2 cm*5 cm*2 mm frame. A sheet of wire was placed into the liquid silicone. The layer was cured in an oven at 80° C. for 30 minutes. After one day the laminate was removed from the frame and the mold. The adhesion was tested by peel adhesion and showed adhesive failure.

The following table summarizes the relevant parameters of the compositions of the two layers:

| Layer | SiH Excess[1] [mmol/100 g] | Silica [mmol/100 g] | SiH:SiVi | SiH Excess: Silica[2] |
|---|---|---|---|---|
| 1st | 20.81 | 282.86 | 4 | 0.0736 |
| 2nd | 1.47 | 282.86 | 1.3 | 0.0052 |

[1]difference (molar amount of all SiH-groups − molar amount of all alkenyl groups in the composition) in mmol/100 g
[2]ratio molar SiH Excess/molar amount of silica Example 10

Comparison

First Layer:

A component: 49.88 g vinyl terminated linear polydimethylsiloxane with a viscosity of 10 Pa s at 25° C., 0.12 g of a platinum solution of the Karstedt type with 1 % of platinum and 41.3 µl ethinylcyclohexanol were thoroughly mixed.

B component: 47.47 g vinyl terminated linear polydimethylsiloxane with a viscosity of 10 Pa s at 25° C., 0.75 g of 3-Methacryloxypropyltrimethoxysilane, 1 g SiH containing adhesion promoter (3.78 mmol SiH/g—same as above) and 0.78 g of cross linker ($M_2D^H{}_{26}$) were mixed thoroughly.

Component A and B were mixed in a ratio of 1:1 and filled into a 2 cm*5 cm*2 mm mold. A sheet of wire was placed into the liquid silicone. The layer was cured in an oven at 80° C. for 30 minutes.

Second Layer:

A component: 49.88 g vinyl terminated linear polydimethylsiloxane with a viscosity of 10 Pa s at 25° C., 0.12 g of a platinum solution of the Karstedt type with 1 % of platinum and 41.3 µl ethinylcyclohexanol were thoroughly mixed.

B component: 46.45 g vinyl terminated linear polydimethylsiloxane with a viscosity of 10 Pa s at 25° C., 0.75 g of 3-Methacryloxypropyltrimethoxysilane, 1 g SiH containing adhesion promoter (3.78 mmol SiH/g—same as above) and 1.8 g of cross linker ($M_2D^H{}_{26}$) were mixed thoroughly.

Component A and B were mixed in a ratio of 1:1 and filled on top of the first layer into a 2 cm*5 cm*2 mm frame. A sheet of wire was placed into the liquid silicone. The layer was cured in an oven at 80° C. for 30 minutes. After one day the laminate was removed from the frame and the mold. The adhesion was tested by peel adhesion and showed adhesive failure.

The following table summarizes the relevant parameters of the compositions of the two layers:

| Layer | SiH Excess[1] [mmol/100 g] | Silica [mmol/100 g] | SiH:SiVi | SiH Excess: Silica[2] |
|---|---|---|---|---|
| 1st | 7.25 | — | 2 | — |
| 2nd | 23.42 | — | 4 | — |

[1] difference (molar amount of all SiH-groups − molar amount of all alkenyl groups in the composition) in mmol/100 g
[2] ratio molar SiH Excess/molar amount of silica The following table compares the peel adhesion force for the examples 8, 9 and 10. Peel forces were measured by the test method ASTM C 794-06.

TABLE 1

| | | Peel adhesion force | | | |
|---|---|---|---|---|---|
| Example | Layer | Silica [%] | SiH/SiVi | SiH Excess: Silica | [N/mm] |
| 8 (Inv) | 1 | 13 | 2 | 0.0308 | 2.44 |
|  | 2 | 17 | 4 | 0.0736 |  |
| 9 (Comp) | 1 | 17 | 4 | 0.0736 | 1.61 |
|  | 2 | 17 | 1.3 | 0.0052 |  |
| 10 (Comp) | 1 | — | 2 | — | 0.31 |
|  | 2 | — | 4 | — |  |

The invention claimed is:

1. A process for the manufacture of encapsulated or embedded electronic devices having a multilayer silicone structure, said multilayer silicone structure prepared by a process comprising the steps of:
   a) applying a first curable silicone composition 1) to the surface of a first substrate, wherein said first silicone composition 1) comprises:
      1-A) one or more polyorganosiloxanes having at least two alkenyl groups per molecule;
      1-B) one or more oxidic fillers, optionally hydrophobized by reaction with one or more hydrophobing agents 1-C);
      1-D) one or more a metal catalysts;
      1-E) one or more polyorganosiloxanes having at least two SiH groups per molecule;
      wherein
      the molar ratio of all SiH groups in the composition 1) to all alkenyl groups in the composition 1) is from >1 to 4;
      the molar ratio of the difference:
      (molar amount of all SiH-groups in the composition 1) —molar amount of all alkenyl groups in the composition 1))
      to
      the molar amount of the oxidic filler 1-B) is <0.035;
   b) curing said first curable silicone composition 1) on the surface of said first substrate;
   c) applying a second curable silicone composition 2) to the surface of said first cured silicone composition 1), wherein said second curable silicone composition 2) comprises:
      2-A) one or more polyorganosiloxanes having at least two alkenyl groups per molecule;
      2-B) optionally one or more oxidic fillers, optionally hydrophobized by reaction with one or more hydrophobing agents 2-C);
      2-D) one or more a metal catalysts;
      2-E) one or more polyorganosiloxanes having at least two SiH groups per molecule;
   wherein the molar ratio of all SiH groups in the composition 2) to all alkenyl groups in the composition 2) is from >1 to 10;
   d) curing said second curable silicone composition 2), to form encapsulated or embedded electronic devices having a multilayer silicone structure.

2. The process according to claim 1, wherein said first curable silicone composition 1) and second curable silicone composition 2) are cured by irradiation and/or heat.

3. The process according to claim 1, wherein said first curable silicone composition 1) is applied to said first substrate in an amount to provide a dry film thickness of 100 to 1000 μm.

4. The process according to claim 1, wherein said second curable silicone composition 2) is applied to provide a wall thickness of the cured second layer of more than 1 mm.

5. The process according to claim 1, wherein said first curable silicone composition 1) has a viscosity of 1 to 100 Pa·s (25° C. —shear rate D =10s$^{-1}$) and wherein said second curable silicone composition 2) has a viscosity of 0.1 to 200 Pa·s (25° C. —shear rate D =10s$^{-1}$).

6. The process according to claim 1, wherein said first curable silicone composition 1) comprises, based on 100 parts per weight of component 1-A), 10 to 50 parts by weight of component 1-B).

7. The process according to claim 1, wherein said first curable silicone composition 1) comprises 1-E) one or more polyorganosiloxanes having at least two SiH groups per molecule selected from the group of linear poly(hydrogenalkyl)siloxanes having more than 20 hydrogenalkylsiloxy groups, preferably more than 23 hydrogenalkylsiloxy groups.

8. The process according to claim 1, wherein after the application of said first curable silicone composition 1) onto the first substrate one or more electrical components are applied on the surface of said first curable silicone composition 1), wherein said first curable silicone composition 1) is cured on the surface of said first substrate, and subsequently said second curable silicone composition 2) is applied thereby covering said one or more electrical components and said first curable silicone composition 1).

9. The process according to claim 1, wherein said second curable silicone composition 2), before applying to the surface of said first silicone composition 1), is applied on a second substrate, and said second curable silicone composition 2) coated on the second substrate, is applied to the surface of said first silicone composition 1), and thereafter curing of said second curable silicone composition 2), is carried out, leading to a multilayer structure having two substrates bonded via the cured first and cured second silicone compositions 1) and 2) between said two substrates.

10. The process according to claim 1, wherein said first silicone composition 1) and said second curable silicone composition 2) have the same or different composition.

11. The process according to claim 1, wherein said first substrate is selected from semiconductors; plastic, metal, ceramic, and glass.

12. The process according to claim 1, wherein said multi-layer silicone structure is used for the manufacture of encapsulated or embedded solar cell modules, encapsulated or embedded integrated circuits; electrical insulators, encapsulated or embedded LEDs, and intermediate layers of displays, monitors or screens.

13. The process according to claim 1, for the manufacture of encapsulated or embedded electronic devices having a multilayer silicone structure wherein the encapsulated or embedded electronic devices having a multilayer silicone structure is a photovoltaic device, said process is selected from:
- (A) a process which comprises the steps of:
  - (a) providing a substrate,
  - (b) applying said first curable silicone composition 1) to the surface of the substrate,
  - (c) providing at least one solar cell onto said first curable silicone composition 1),
  - (d) curing said first curable silicone composition 1),
  - (e) applying said second curable silicone composition 2) to the surface of the layer formed of the first cured silicone composition 1) and to the surface of the solar cells if not yet covered completely,
  - (f) optionally applying a back skin substrate to the surface of the structure obtained in step (e),
  - (g) curing said second curable silicone composition 2); or
- (B) a process which comprises the steps of:
  - (a) providing a substrate,
  - (b) applying said first curable silicone composition 1) to the surface of the substrate,
  - (c) providing at least one solar cell onto said first curable silicone composition 1),
  - (d) curing said first curable silicone composition 1),
  - (e) applying said second curable silicone composition 2) to the surface of a back skin substrate;
- (f) applying said back skin substrate with the layer of the second curable silicone composition 2) to the surface of the layer of the first curable silicone composition 1) to bring the first and second layers of the curable silicone compositions into contact with each other,
  - (g) curing said second curable silicone composition 2); or
- (C) a process which comprises the steps of:
  - (a) providing solar cells,
  - (b) applying said first curable silicone composition 1) onto the solar cells,
  - (c) providing a substrate on the surface of the layer of said first curable silicone composition 1),
  - (d) curing said first curable silicone composition 1),
  - (e) applying a second curable silicone composition 2) onto the surface of the layer of the first silicone composition 1),
  - (f) optionally applying a back skin substrate onto the layer of said second curable silicone composition 2),
  - (g) curing said second curable silicone composition 2)
  wherein said first silicone composition 1) comprises:
  1-A) one or more polyorganosiloxanes having at least two alkenyl groups per molecule;
  1-B) one or more oxidic fillers, optionally hydrophobized by reaction with one or more hydrophobing agents 1-C);
  1-D) one or more a metal catalysts;
  1-E) one or more polyorganosiloxanes having at least two SiH groups per molecule;
  wherein
  the molar ratio of all SiH groups in the composition 1) to all alkenyl groups in the composition 1) is from >1 to 4;
  the molar ratio of the difference:
  (molar amount of all SiH-groups in the composition 1) —molar amount of all
  alkenyl groups in the composition 1))
  to
  the molar amount of the oxidic filler 1-B) is <0.035; and
  wherein said second curable silicone composition 2) comprises:
  2-A) one or more polyorganosiloxanes having at least two alkenyl groups per molecule;
  2-B) optionally one or more oxidic fillers, optionally hydrophobized by reaction with one or more hydrophobing agents 2-C);
  2-D) one or more a metal catalysts;
  2-E) one or more polyorganosiloxanes having at least two SiH groups per molecule;
  wherein the molar ratio of all SiH groups in the composition 2) to all alkenyl groups in the composition 2) is from >1 to 10.

14. The process of claim 1, wherein in step (a), the polyorganosiloxanes 1-E) having at least two SiH groups per molecule have (i) a molar ratio of all SiH groups in the composition 1) to all alkenyl groups in the composition 1) of from >1 to 2.5.

15. The process of claim 1, wherein in step (a), the polyorganosiloxanes 1-E) having at least two SiH groups per molecule have (i) a molar ratio of all SiH groups in the composition 1) to all alkenyl groups in the composition 1) of from >1 to 2.

16. The process of claim 15, wherein in step (a), the polyorganosiloxanes 1-E) having at least two SiH groups per molecule have (i) a molar ratio of all SiH groups in the composition 1) to all alkenyl groups in the composition 1) of from >1 to 2.

17. The process of claim 16, wherein in step (c) the polyorganosiloxanes 2-E) having at least two SiH groups per molecule have a molar ratio of all SiH groups in the composition 2) to all alkenyl groups in the composition 2) of from 1.05 to 10.

18. The process of claim 1, wherein in step (c) the polyorganosiloxanes 2-E) having at least two SiH groups per molecule have a molar ratio of all SiH groups in the composition 2) to all alkenyl groups in the composition 2) of from 1.05 to 10.

* * * * *